US00RE42962E

(19) United States
(12) Reissued Patent
Yonemitsu et al.

(10) Patent Number: US RE42,962 E
(45) Date of Reissued Patent: Nov. 22, 2011

(54) OPTICAL DISK AND METHOD AND APPARATUS FOR RECORDING AND THEN PLAYING INFORMATION BACK FROM THAT DISK

(75) Inventors: Jun Yonemitsu, Kanagawa (JP); Ryuichi Iwamura, San Diego, CA (US); Shunji Yoshimura, Tokyo (JP); Makoto Kawamura, Kanagawa (JP)

(73) Assignee: Sony Corporation, Tokyo (JP)

(21) Appl. No.: 09/522,786

(22) Filed: Mar. 7, 2000

Related U.S. Patent Documents

Reissue of:
(64) Patent No.: 5,793,779
Issued: Aug. 11, 1998
Appl. No.: 08/457,844
Filed: Jun. 1, 1995

U.S. Applications:
(62) Division of application No. 08/405,852, filed on Mar. 17, 1995, now Pat. No. 5,715,355.

(30) Foreign Application Priority Data

Mar. 19, 1994 (JP) ..... 06-074444

(51) Int. Cl.
*G11B 7/013* (2006.01)
*G11B 20/18* (2006.01)

(52) U.S. Cl. ..... 714/701; 714/755; 714/769; 369/275.3

(58) Field of Classification Search ..... 714/755, 714/756, 769, 701; 369/275.3
See application file for complete search history.

(56) References Cited

U.S. PATENT DOCUMENTS 4,348,659 A * 9/1982 Fujimori et al. ..... 340/347 AD
4,413,340 A * 11/1983 Odaka et al. ..... 371/38.1
RE31,666 E * 9/1984 Doi et al. ..... 371/43
4,476,562 A * 10/1984 Sako et al. ..... 371/37.5
(Continued)

FOREIGN PATENT DOCUMENTS

EP 0 233 783 A1 8/1987
(Continued)

OTHER PUBLICATIONS

French, "Alternative Modulation Codes for the Compact Disc", IEEE Trans. on Consumer Electronics, vol. 34, No. 4, pp. 908-913, Nov. 1988.*

(Continued)

*Primary Examiner* — Stephen M Baker
(74) *Attorney, Agent, or Firm* — Oblon, Spivak, McClelland, Maier & Neustadt, L.L.P.

(57) ABSTRACT

An optical disk having a diameter less than 140 mm and, a thickness of 1.2 mm±0.1 mm, with a plurality of record tracks having data recorded thereon as embossed pits representing information and exhibiting a track pitch in the range between 0.646 μm and 1.05 μm; with the tracks being divided into a lead-in area, a program area and a lead-out area. The data includes table of contents (TOC) information recorded in a plurality of sectors in at least one TOC track and user information recorded in a plurality of sectors in user tracks; with the TOC information including addresses of start sectors recorded in the user tracks. The data (both user and TOC information) is encoded in a long distance error correction code having at least eight parity symbols, and is run length limited (RLL) modulated.

72 Claims, 29 Drawing Sheets

U.S. PATENT DOCUMENTS

| | | | | | |
|---|---|---|---|---|---|
| 4,499,454 | A | * | 2/1985 | Shimada | 340/347 DD |
| 4,512,006 | A | | 4/1985 | Murakami et al. | |
| 4,833,471 | A | | 5/1989 | Tokuume et al. | 341/67 |
| 5,065,388 | A | * | 11/1991 | Roth et al. | 369/47 |
| 5,198,813 | A | * | 3/1993 | Isozaki | 341/59 |
| 5,239,531 | A | * | 8/1993 | Abe | 369/109 |
| 5,243,588 | A | * | 9/1993 | Maeda et al. | 369/54 |
| 5,276,674 | A | | 1/1994 | Tanaka | 369/275.3 |
| 5,282,192 | A | * | 1/1994 | Yamada et al. | 369/279.3 |
| 5,315,400 | A | * | 5/1994 | Kurata et al. | 358/335 |
| 5,325,352 | A | * | 6/1994 | Matsumoto | 369/275.4 |
| 5,351,132 | A | * | 9/1994 | Sawabe et al. | 358/342 |
| 5,353,277 | A | * | 10/1994 | Yasuda et al. | 369/275.4 |
| 5,357,494 | A | * | 10/1994 | Aratani | 369/13 |
| 5,371,602 | A | * | 12/1994 | Tsuboi et al. | 358/335 |
| 5,377,178 | A | * | 12/1994 | Saito et al. | 369/124 |
| 5,388,093 | A | * | 2/1995 | Yoshida et al. | 369/124 |
| 5,426,624 | A | * | 6/1995 | Goto | 369/32 |
| 5,428,598 | A | * | 6/1995 | Veldhuis et al. | 369/275.3 |
| 5,434,829 | A | * | 7/1995 | Maeda et al. | 369/48 |
| 5,446,714 | A | * | 8/1995 | Yoshio et al. | 369/48 |
| 5,455,684 | A | * | 10/1995 | Fujinami et al. | 358/335 |
| 5,463,565 | A | * | 10/1995 | Cookson et al. | 364/514 R |
| 5,471,606 | A | * | 11/1995 | Huang et al. | 395/500 |
| 5,477,525 | A | * | 12/1995 | Okabe | 369/275.3 |
| 5,493,558 | A | * | 2/1996 | Kihara | 369/275.2 |
| 5,506,823 | A | * | 4/1996 | Sanada | 369/48 |

FOREIGN PATENT DOCUMENTS

| | | | |
|---|---|---|---|
| EP | 0 248 536 | A2 | 12/1987 |
| EP | 0 342 833 | A2 | 11/1989 |
| EP | 0 418 964 | A1 | 3/1991 |
| EP | 0 466 399 | A2 | 1/1992 |
| EP | 0 498 574 | A2 | 8/1992 |
| EP | 0 536 764 | A1 | 4/1993 |
| EP | 0 674 316 | A2 | 3/1995 |
| WO | WO 94/07332 | A | 3/1994 |
| WO | WO 95/222802 | A | 8/1995 |

OTHER PUBLICATIONS

Saito et al., "Demonstration of High Data Density Recording on Direct Overwrite Magneto-Optical Disk", IEEE Trans. on Magnetics, vol. 28, No. 5, pp. 2512-2514, Sep. 1992.*

Yoshimura et al., "Large-Capacity Magneto-Optical Disk System Using Magnetically Induced Super Resolution", IEEE Trans. on Consumer Electronics, vol. 38, No. 3, pp. 660-665, Aug. 1992.* van der Meer, "The Full-Motion System for CD-I", IEEE Trans. on Consumer Electronics, vol. 38, No. 4, pp. 910-922, Nov. 1992.*

Miyaoka S: "Digital Audio is Compact and Rugged" IEEE Spectrum, Mar. 1984, USA, vol. 21, No. 3, pp. 35-39, XP002155949.

French, "Alternative Modulation Codes for the Compact Disc", IEEE Transactions on Consumer Electronics, vol. 34, No. 4, Nov. 1988, pp. 908-913, Nov. 1988.

Saito et al., "Demonstration of High Data Density Recording on Direct Overwrite Magneto-Optical Disk", IEEE Transactions on Magnetics, vol. 28, No. 5, Sep. 1992, pp. 2512-2514 Dec. 1992.

Yoshimura, S., et al., "Large-Capacity Magneto-Optical Disk System Using Magnetically Induced Super Resolution", IEEE Transactions on Consumer Electronics, vol. 38, No. 3, pp. 660-665 Aug. 1992.

J. van der Meer, "The Full Motion System for CD-I", IEEE Transactions on Consumer Electronics, vol. 38, No. 4, pp. 910-922 Nov. 1992.

* cited by examiner

CONTENTS OF SPEED SETTING

| | |
|---|---|
| 0 | NO REAL TIME DATA |
| 1 | FIXED RATE (×1) |
| 2 | FIXED RATE (×2) |
| 3 | FIXED RATE (×3) |
| 4 | RESERVED |
| 5 | RESERVED |
| 6 | FIXED RATE (×6) |
| 7~FE | RESERVED |
| FF | VARIABLE RATE (~×6) |

FIG.8

DATE & TIME FORMAT

| FIELD NAME | BITS |
|---|---|
| YEAR (4 DIGITS) | 16 |
| MONTH (2 DIGITS) | 8 |
| DAY (2 DIGITS) | 8 |
| HOURS (2 DIGITS) | 8 |
| MINIUTES (2 DIGITS) | 8 |
| SECONDS (2 DIGITS) | 8 |
| TOTAL | 56 |

FIG.9

(A)

(SUBCODE ADDRESS=0)

| FIELD NAME | BYTES |
|---|---|
| SUBCODE ADDRESS (=0) | 1 |
| ZERO DATA (=0) | 4 |
| TOTAL | 5 |

(B)

(SUBCODE ADDRESS=1)

| FIELD NAME | BYTES |
|---|---|
| SUBCODE ADDRESS (=1) | 1 |
| TRACK NUMBER | 1 |
| COPYRIGHT BYTE | 1 |
| APPLICATION ID | 1 |
| ECC TYPE | 1 |
| TOTAL | 5 |

(C)

(SUBCODE ADDRESS=2)

| FIELD NAME | BYTES |
|---|---|
| SUBCODE ADDRESS (=2) | 1 |
| TIME CODE | 4 |
| TOTAL | 5 |

(D)

(SUBCODE ADDRESS=3)

| FIELD NAME | BYTES |
|---|---|
| SUBCODE ADDRESS (=3) | 1 |
| PREV I DISTANCE | 2 |
| NEXT I DISTANCE | 2 |
| TOTAL | 5 |

(E)

(SUBCODE ADDRESS=4)

| FIELD NAME | BYTES |
|---|---|
| SUBCODE ADDRESS (=4) | 1 |
| PICTURE TYPE | 1 |
| TEMPORAL REFERENCE | 2 |
| RESERVED | 1 |
| TOTAL | 5 |

FIG.11

| FIELD NAME | BITS |
|---|---|
| ANALOG VIDEO OUT | 1 |
| ANALOG AUDIO OUT | 1 |
| DIGITAL VIDEO OUT | 1 |
| DIGITAL AUDIO OUT | 1 |
| VIDEO BITSTREAM OUT | 1 |
| AUDIO BITSTREAM OUT | 1 |
| SUBTITLE BITSTREAM OUT | 1 |
| MUXED BITSTREAM OUT | 1 |
| TOTAL | 8 |

FIG.12

CONTENTS OF APPLICATION ID

| | |
|---|---|
| 0 | NO DATA |
| 1 | COMPUTER STORAGE |
| 2 | VIDEO DISC (DVD) |
| 3-FF | RESERVED |

FIG.13

TIME CODE FORMAT

| FIELD NAME | BITS |
|---|---|
| HOURS (2 DIGITS) | 8 |
| MINIUTES (2 DIGITS) | 8 |
| SECONDS (2 DIGITS) | 8 |
| FRAMES (2 DIGITS) | 8 |
| TOTAL | 32 |

FIG.14

CONTENTS OF PICTURE TYPE

| | |
|---|---|
| 0 | I PICTURE |
| 1 | P PICTURE |
| 2 | B PICTURE |
| 3~FF | RESERVED |

FIG.15

CONTENTS OF ECC TYPE

| | |
|---|---|
| 0 | LONG ECC |
| 1 | SHORT ECC |
| 2~FF | RESERVED |

FIG.16

| 14 BIT DATA D1 | | | | | | | | | | | | | | INHIBIT MARGIN BIT | | 14 BIT DATA D2 | | | | | | | | | | | | | |
|---|---|---|---|---|---|---|---|---|---|---|---|---|---|---|---|---|---|---|---|---|---|---|---|---|---|---|---|---|---|
| C1 | C2 | C3 | C4 | C5 | C6 | C7 | C8 | C9 | C10 | C11 | C12 | C13 | C14 | 1 | 2 | C1 | C2 | C3 | C4 | C5 | C6 | C7 | C8 | C9 | C10 | C11 | C12 | C13 | C14 |
| X | X | X | X | X | X | X | X | X | X | X | X | X | X | 0 | 0 | 0 | 0 | 0 | 0 | 0 | 0 | 0 | 0 | X | X | X | X | X | X |
| X | X | X | X | X | X | X | X | X | X | X | X | X | 0 | | | 0 | 0 | 0 | 0 | 0 | 0 | 0 | X | X | X | X | X | X | X |
| X | X | X | X | X | X | X | X | X | X | X | X | 0 | 0 | | | 0 | 0 | 0 | 0 | 0 | 0 | X | X | X | X | X | X | X | X |
| X | X | X | X | X | X | X | X | X | X | X | 0 | 0 | 0 | | | 0 | 0 | 0 | 0 | 0 | X | X | X | X | X | X | X | X | X |
| X | X | X | X | X | X | X | X | X | X | 0 | 0 | 0 | 0 | | | 0 | 0 | 0 | 0 | X | X | X | X | X | X | X | X | X | X |
| X | X | X | X | X | X | X | X | X | 0 | 0 | 0 | 0 | 0 | | | 0 | 0 | 0 | X | X | X | X | X | X | X | X | X | X | X |
| X | X | X | X | X | X | X | X | 0 | 0 | 0 | 0 | 0 | 0 | | | 0 | 0 | X | X | X | X | X | X | X | X | X | X | X | X |
| X | X | X | X | X | X | X | 0 | 0 | 0 | 0 | 0 | 0 | 0 | | | 0 | X | X | X | X | X | X | X | X | X | X | X | X | X |
| X | X | X | X | X | X | 0 | 0 | 0 | 0 | 0 | 0 | 0 | 0 | | | X | X | X | X | X | X | X | X | X | X | X | X | X | X |
| X | X | X | X | X | X | X | X | X | X | X | X | X | X | 0 | 1 | 1 | X | X | X | X | X | X | X | X | X | X | X | X | X |
| X | X | X | X | X | X | X | X | X | X | X | X | X | X | | | X | 1 | X | X | X | X | X | X | X | X | X | X | X | X |
| X | X | X | X | X | X | X | X | X | X | X | X | X | 1 | | | X | X | X | X | X | X | X | X | X | X | X | X | X | X |
| X | X | X | X | X | X | X | X | X | X | X | X | X | 1 | 1 | 0 | X | X | X | X | X | X | X | X | X | X | X | X | X | X |
| X | X | X | X | X | X | X | X | X | X | X | X | 1 | X | | | X | X | X | X | X | X | X | X | X | X | X | X | X | X |
| X | X | X | X | X | X | X | X | X | X | X | X | X | X | | | 1 | X | X | X | X | X | X | X | X | X | X | X | X | X |

FIG.28

OPTICAL DISK AND METHOD AND APPARATUS FOR RECORDING AND THEN PLAYING INFORMATION BACK FROM THAT DISK

Matter enclosed in heavy brackets [ ] appears in the original patent but forms no part of this reissue specification; matter printed in italics indicates the additions made by reissue.

This application is a division of application Ser. No. 08/405,852, filed [Mar. 13, 1995] *Mar. 17, 1995 now U.S. Pat. No. 5,715,355.*

BACKGROUND OF THE INVENTION

The invention relates to a novel optical disk and, more particularly, to that disk, to a method of recording and reading information on the disk and to apparatus for carrying out that method.

Optical disks have been used as mass storage devices for computer applications, and such optical disks are known as CD-ROMs. The disk which is used as the CD-ROM is modeled after the standard compact disk (CD) that has been developed for audio applications and is basically an audio CD with various improvements and refinements particularly adapted for computer applications. Using such a CD as a standard. the CD-ROM has a data storage capacity of about 600 Mbytes. By using audio CD technology as its basis, the, CD-ROM and its disk drive have become relatively inexpensive and are quite popular.

However, since conventional audio CDs with their inherent format and storage capacity have been adapted for CD-ROMS, it has heretofore been difficult to improve the data storage capacity. In typical computer applications, a capacity of 600 Mbytes has been found to be insufficient.

Also, the data transfer rate that can be obtained from audio CDs generally is less than 1.4 Mbits/sec (Mbps). However, computer applications generally require a transfer rate far in excess of 1.4 Mbps; but it is difficult to attain a faster transfer rate with conventional CD-ROMS.

Yet another disadvantage associated with conventional CD-ROMs, and which is due to the fact that the audio CD format has been adapted for computer applications, is the relatively long access time associated with accessing a particular location on the disk. Typically, relatively long strings of data are read from audio CDs, whereas computer applications often require accessing an arbitrary location to read a relatively small amount of data therefrom. For example, accessing a particular sector may take too much time for the CD controller to identify which sector is being read by the optical pick-up.

A still further difficulty associated with CD-ROMs, and which also is attributed to the fact that such CD-ROMs are based upon audio CD technology, is the error correcting ability thereof. When audio data is reproduced from an audio CD, errors that cannot be corrected nevertheless can be concealed by using interpolation based upon the high correlation of the audio information that is played back. However, in computer applications, interpolation often cannot be used to conceal errors because of the low correlation of such data. Hence, the data that is recorded on a CD-ROM must be encoded and modulated in a form exhibiting high error correcting ability. Heretofore, data has been recorded on a CD-ROM in a conventional cross interleave Reed-Solomon code (CIRC) plus a so-called block completion error correction code. However, the block completion code generally takes a relatively long amount of time to decode the data, and more importantly, its error correction ability is believed to be insufficient in the event that multiple errors are present in a block. Since two error correction code (ECC) techniques are used for a CD-ROM, whereas only one ECC technique is used for an audio CD (namely, the CIRC technique), a greater amount of non-data information must be recorded on the CD-ROM to effect such error correction, and this non-data information is referred to as "redundant" data. In an attempt to improve the error correction ability of a CD-ROM, the amount of redundancy that must be recorded is substantially increased.

OBJECTS OF THE INVENTION

Therefor, it is an object of the present invention to provide an improved optical disk having particular use as a CD-ROM which overcomes the aforenoted difficulties and disadvantages associated with CD-ROMs which have been used heretofore.

Another object of this invention is to provide an optical disk which exhibits a higher access speed, thereby permitting quick access of arbitrary locations, such as sectors, to be accessed quickly.

A further object of this invention is to provide an improved optical disk having a higher transfer rate than the transfer rate associated with CD-ROMs heretofore used.

A further object of this invention is to improve the storage capacity of an optical disk, thereby making it more advantageous for use as a CD-ROM.

An additional object is to provide an improved optical disk which stores data with reduced redundancy.

Still another object of this invention is to provide an improved recording format for an optical disk which enhances the error correcting ability thereof.

Another object of this invention is to provide an optical disk having a substantially improved recording density, thereby facilitating use of the disk as a CD-ROM.

A further object of this invention is to provide an improved optical disk having data recorded in sectors, with each sector having a sector header that is easily and rapidly read, particularly because the sector header is not encoded in a form which requires a substantially long amount of time before it is successfully decoded and recognized.

Various other objects, advantageous and features of the present invention will become readily apparent from the ensuing detailed description, and the novel features will be particularly pointed out in the appended claims.

SUMMARY OF THE INVENTION

In accordance with this invention, an optical disk, a method and apparatus for recording that disk and a method and apparatus for reading data from that disk are provided. The disk has a diameter of less than 140 mm, a thickness of 1.2 mm±0.1 mm, and a plurality of record tracks exhibiting a track pitch in the range between 0.646 μm and 1.05 μm with data recorded in those tracks as embossed pits. The tracks are divided into a lead-in area, a program area and a lead-out are, with table of content (TOC) information being recorded in at least one TOC track in the lead-in area and user information recorded in a plurality of user tracks in the program area. Each track is divided into sectors and the TOC information includes addresses of the start sectors of each user track. The data (both TOC and user information) is encoded in a long distance error correction code having at least eight parity symbols, the encoded data being modulated and recorded on the disk. Preferably, the data is modulated as run length limited (RLL) data.

In the preferred embodiment, the data is recorded with a linear density in the range between 0.237 μm per bit and 0.378 μm per bit. Also, the program area is disposed in a portion of the disk having a radius from 20 mm to 65 mm.

The format of the data advantageously permits rapid access to a desired sector. Reduced redundancy in the recorded data and a higher storage capacity are attained. Advantageously, the optical disk may record data having particular computer application, referred to computer data or video and audio data, the latter being compressed by the so-called MPEG (Moving Picture Image Coding Experts Group) technique. Audio data which also may be recorded preferably is compressed and then multiplexed with the MPEG-compressed video data.

The error correction code used with the present invention preferably is a long distance code having at least eight parity symbols. ECC techniques which have been used heretofore have relied upon so-called short distance codes in which a block of data is divided into two sub-blocks, each sub-block being associated with a number of parity symbols, such as 4 parity symbols. It is known, however, that 4 parity symbols may be used to correct 4 data symbols, and if 4 data symbols in each sub-block are erroneous, the total number of 8 erroneous data symbols can be corrected. But, if one sub-block contains 5 erroneous data symbols, whereas the other sub-block contains 3 erroneous data symbols, use of the short distance code may be effective to correct only 4 data symbols in the one sub-block, thus permitting a total error correction of 7 data symbols. But, in the long distance code, the block of data is not sub-divided; and as a result, all 8 erroneous data symbols, if present in the long distance coded data, can be corrected.

As another feature of this invention, the RLL code that is used preferably converts 8 bits of input data into 16 bits of data for recording (referred to as 16 channel bits) with no margin bits provided between successive 16-bit symbols. In RLL codes used heretofore, 8 data bits are converted into 14 channel bits and three margin bits are inserted between successive 14-bit symbols. Thus, the present invention achieves a reduction in redundancy.

BRIEF DESCRIPTION OF THE DRAWINGS

The following detailed description, given by way of example and not intended to limit the present invention solely thereto, will best understood in conjunction with the accompanying drawings in which:

FIG. 8 is a tabular representation of a portion of the information recorded in the TOC region of the disk;

FIG. 9 is a tabular representation of another portion of the data recorded in the TOC region;

FIGS. 11A–11E are tabular representations of different types of subcode data that may be recorded in a sector;

FIG. 12 is a tabular representation of copyright data that may be recorded as subcode information in a sector;

FIG. 13 is a tabular representation of application ID information that may be recorded as the subcode information in a sector;

FIG. 14 is a tabular representation of time-code data that may be recorded as the subcode information in a sector;

FIG. 15 is a tabular representation of picture-type data that may be recorded as the subcode information in a sector;

FIG. 16 is a tabular representation of ECC type data that may be included in the TOC information recorded in the TOC regions;

FIG. 28 is a table which explains how margin bits are selected/inhibited when forming the string of EFM data shown in FIG. 24;

DETAILED DESCRIPTION OF PREFERRED EMBODIMENTS

Figure 1:
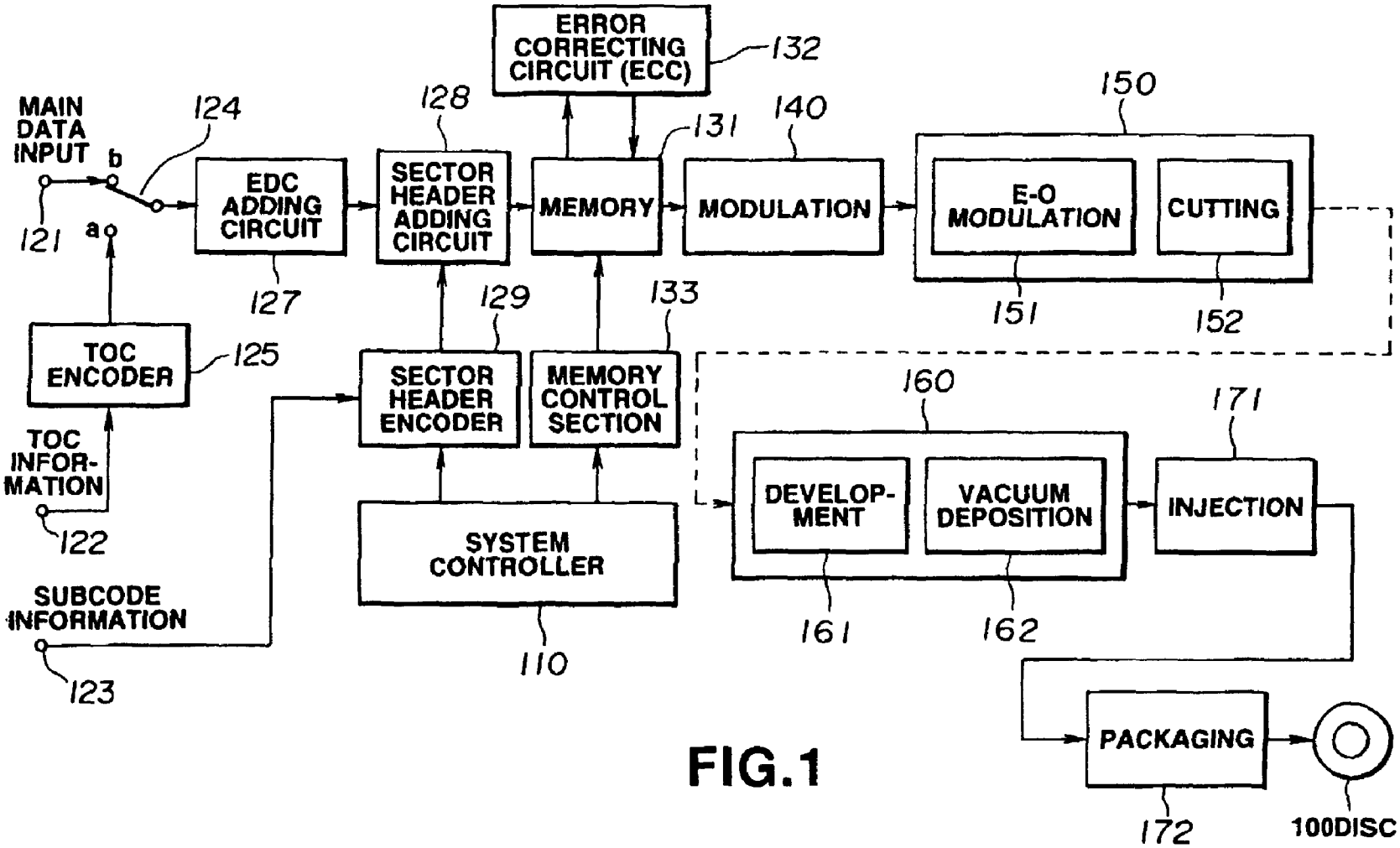
FIG. 1 is a block diagram of the preferred technique by which optical disks are made in accordance with the present invention.

The present invention records different types of data on an optical disk, preferably for use as a CD-ROM but also adapted for use as a digital video disk (DVD). Such data may be file data or application data to be used by a computer, or it may comprise video data which sometimes is referred to herein as motion picture data which includes image information and audio information and which preferably is compressed in accordance with the various conventional video data compression standards, such as those known MPEG-1, MPEG-2, or when still video pictures are recorded, JPEG. It will be appreciated, therefore, that the information on the disk admits of "multimedia" applications.

Before describing the technique used to record data on the optical disk, a brief description is provided of the disk itself. The physical parameters of the optical disk used with the present invention are quite similar to the conventional audio CD; and for this reason, a drawing figure of the disk is not provided. Nevertheless, it will be appreciated that the diameter of the disk is 140 mm or less, preferably 120 mm or 135 mm. Data is recorded in tracks, and will be described in greater detail, having a track pitch in the range between 0.646 μm and 1.05 μm, and preferably in the range of 0.7 to 0.9 μm. Like audio CD data, the data recorded on the optical disk is in the form of embossed pits having a linear density in the range between 0.237 μm per bit and 0.387 μm per bit, although this range could be in the range of 0.3 μm to 0.4 μm per bit. Data is recorded in that portion of the disk having a radius from 20 mm to 65 mm. The disk, whose thickness is 1.2 mm±0.1 mm, is intended to be driven for a playback operation such that its linear velocity is in the range of 3.3 m to 5.3 m per second.

As a result of the linear density and track pitch of the disk, information is optically read from the disk by a pick-up head which projects a light beam of wavelength λ through a lens having a numerical aperture NA such that the projected beam exhibits a spatial frequency l, where $l=\lambda/(2NA)$. The light source for the optical pick-up preferably is a laser beam whose wave length is λ=635 nm, this laser beam being projected through a lens whose numerical aperture is NA=0.52, resulting in the spatial frequency l=611 nm.

Typical examples of the physical parameters associated with the optical disk are as following:

Disk diameter=120 mm.

Program area=23 mm to 58 mm.

Track pitch=0.84 μm.

Linear density=0.307 μm.

This results in a data storage capacity of 4.4 Gbytes.

One proposed structure for recording data on the optical disk is known as the EFM Plus frame (EFM refers to eight-to-fourteen modulation). An EFM Plus frame is formed of 85 data symbols (each symbols is a 16-bit representation of an 8-bit byte) plus two synchronizing symbols thus consisting of 87 16-bit symbols. One sector is comprised of 14×2 EFM plus frames. But, the amount of user information that is present in a sector, that is, the amount of information which contains useful data and thus excludes sector header information, error detection code (EPC) information, et cetera, is 2048 symbols. Accordingly, the efficiency of the EFM Plus format may be calculated as:

$$(2048\times16)/(87\times16\times14\times2)=0.8407.$$

That is, the efficiency of the EFM Pius format is approximately 84%, which means that 84% of all of the data that is recorded in a sector is useful data. Therefore, if the storage capacity of the optical disk is 4.4 Gbytes, as mentioned above, the amount of user data that can be stored on the disk is 84%×4.4 Gbytes=3.7 Gbytes.

Of course, if the track pitch is varied and/or if the linear density of the embossed pits is varied, the storage capacity of the disk likewise is varied. For example, if the track pitch is on the order of about 0.646 μm, the storage capacity of the disk may be on the order of about 6.8 Gbytes, whereas if the track pitch is on the order of about 1.05 μm, the storage capacity is on the order of about 4.2 Gbytes. As a practical matter, however, the spatial frequency of the pick-up beam determines the minimum track pitch and minimum linear density because it is desirable that the track pitch be no less than the spatial frequency of the pick-up beam and the linear density be no less than one-half the spatial frequency of the pick-up beam.

When compared to the audio CD, the linear density of the recorded data of the optical disk used in the present invention is approximately 1.7 times the linear density of the audio CD and the recording capacity of the optical disk used with the present invention is approximately 5.5 times the recording capacity of the audio CD. The optical disk of the present invention is driven to exhibit a linear velocity of approximately four times the linear velocity of the audio CD and the data transfer rate of the optical disk of the present invention is approximately 9 Mbps, which is about six times the data transfer rate of the audio CD.

With the foregoing in mind, reference is made to FIG. 1 which is a block diagram of the technique used to make an optical disk of the type that has just been described. An input terminal 121 is supplied with user data to be recorded, this data being formed of, for example, multiplexed video and audio information, title data and sub-information such as, but not limited to, computer files, character data, graphic information, et cetera. The data supplied to input terminal 121 is produced by the apparatus shown in FIG. 32 and will be described below.

The user data is coupled to a change-over switch 124 which also is adapted to receive table of content (TOC) information supplied to the switch from an input terminal 122 via a TOC encoder 125. The TOC information identifies various parameters of the disk which are used for accurate reproduction of the user information recorded thereon; and the TOC information also includes data related to the user information per se, such as information that is helpful in rapidly accessing the user information recorded in particular tracks. The structure of the TOC information is described below.

Switch 124 selectively couples user data supplied at input terminal 121 and encoded TOC data supplied at input terminal 122 to an or detection code (EDC) adder 127. As will be described, TOC information is recorded on one portion of the disk and user data is recorded on another portion; and switch 124 selects either the TOC information or the user data at the appropriate times. As will be described below in conjunction with, for example, FIG. 21, the error detection code is added at the end of a sector of user data or TOC information; and adder 127 serves to produce the error detection code after a sector of data has been received and then adds the error detection code to the end of the sector of data. In the preferred embodiment, a sector is comprised of 2048 bits of useful data plus parity bytes, plus sector header data, plus a number of "reserved" bytes, plus the EDC code.

Figure 10:
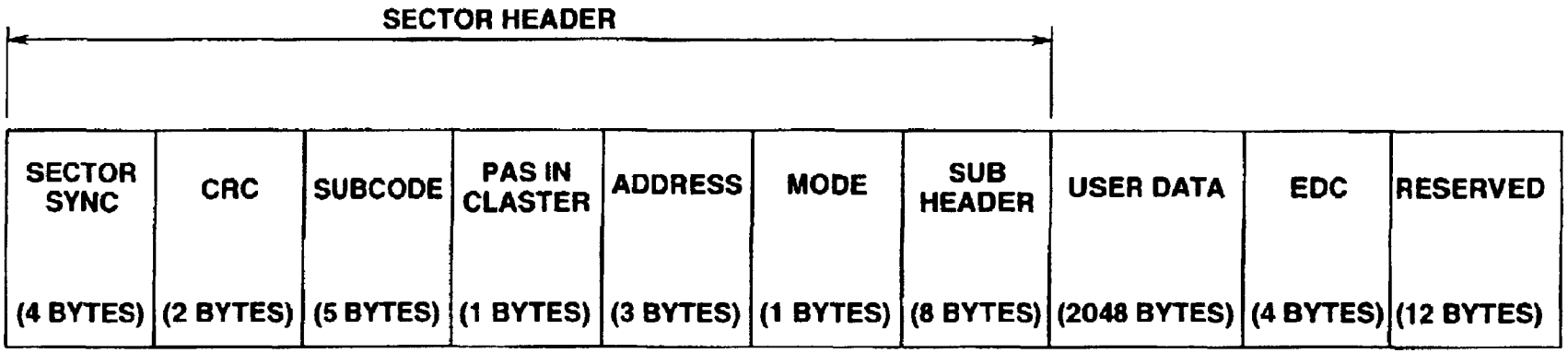
FIG. 10 is a schematic representation of a sector of data recorded on the disk.

A sector header adder 128 is adapted to add a sector header to each sector of user information supplied thereto by way of EDC adder 127. As will be described below in conjunction with FIG. 10, a sector header includes a synchronizing pattern and information useful to rapidly identify access the sector. Such information, particularly in sectors containing user data, includes subcode information which is coupled to the sector header adder by way of a sector header encoder 129, the latter operating to encode subcode information supplied thereto by way of input terminal 123. Such subcode information is generated by a suitable source and, as will be described further below in conjunction with FIG. 11, it is used to provide helpful identifying and control information related to the user data that is recorded on the disk. For example, the subcode information identifies the track number in which the sector which contains this subcode information is recorded, copyright management information which determines whether the data reproduced from the disk, such as video data, may be copied, application ID information which designates the particular user-application for the data recorded in the sector, time code data which represents time information at which the user data is recorded, and information relating to video pictures that may be recorded on the disk, such as the distance, or separation, between a video picture recorded in this sector and the next-following and the next-preceding video pictures. A system controller 110 controls sector header encoder 129 to make certain that the proper subcode information and other sector header information (as shown in FIG. 10) is placed in the proper data location for proper recording in a user track.

User data, including the sector header added thereto by reason of sector header adder 128, is subjected to error correction encoding carried out by an ECC circuit 132 in combination with a memory 131 and a memory control section 133, the latter being controlled by system controller 110. An example of ECC encoding that may be used with the present invention, subject to modification so as to be applicable to the data recorded on the optical data is described in U.S. Pat. No. Re. 31,666. In one embodiment of the present invention, the ECC encoding produced by circuit 132 is convolution coding and is described in greater detail below in conjunction with FIG. 17. It is sufficient for an understanding of FIG. 1 simply to point out that the ECC encoding assembles a frame of data bytes or symbols, referred to as a C2 code word formed of, for example, 116 bytes or symbols, and generates C2 parity bytes as a function of a respective data byte or symbol in a predetermined number of C2 code wards. For examples if the data bytes or symbols in each C2 code word exhibit the sequence 1, 2, . . . 116, a C2 parity byte, or symbol, may be produced by combining byte 1 from C2 code word $C2_1$ and byte 2 from $C2_2$. Another C2 parity byte may be produced by combining the third byte of C2 code word $C2_3$ and the fourth byte of $C2_4$. In this manner, the C2 parity bytes are generated by a cross-interleave technique; and as an example, 12 such C2 parity bytes are added to the C2 code word $C2_1$, even though such C2 parity bytes relate to data bytes included in other C2 words. Then, C1 parity bytes are generated for the C2 word (such as $C2_1$) to which has been added the C2 parity bytes, resulting in what is referred herein as a C1 code word (such as $C1_1$). The resultant C1 code word, consisting of 116 data bytes, plus 12 C2 parity bytes, plus 8 C1 parity bytes is stored in memory 131.

The sequential order of the data bytes in the C1 code words stored in memory 131 is rearranged by, for example, delaying the odd bytes so as to form an odd group of data bytes and an even group of data bytes. Since each group consists of only one-half of the data bytes included in the C1 code word, an odd group of data bytes of one C1 code word is combined with an even group of data bytes of the next-following C1 code word, thus forming a disarranged order of bytes. This disarranged order improves the burst error immunity of the ECC encoded data. The disarranged order of the ECC-encoded bytes is supplied from memory 131 to a modulator 140 which, preferably, carries out 8-to-16 modulation, although 8-to-14 (EFM) modulation could be used, if desired.

Memory controller 133 supplies to memory 131 the necessary read and write addresses to enable the generation of the C2 parity bytes in cross-interleaved form and also to rearrange the sequential order of the data bytes into the aforementioned disarranged order.

Figure 18:
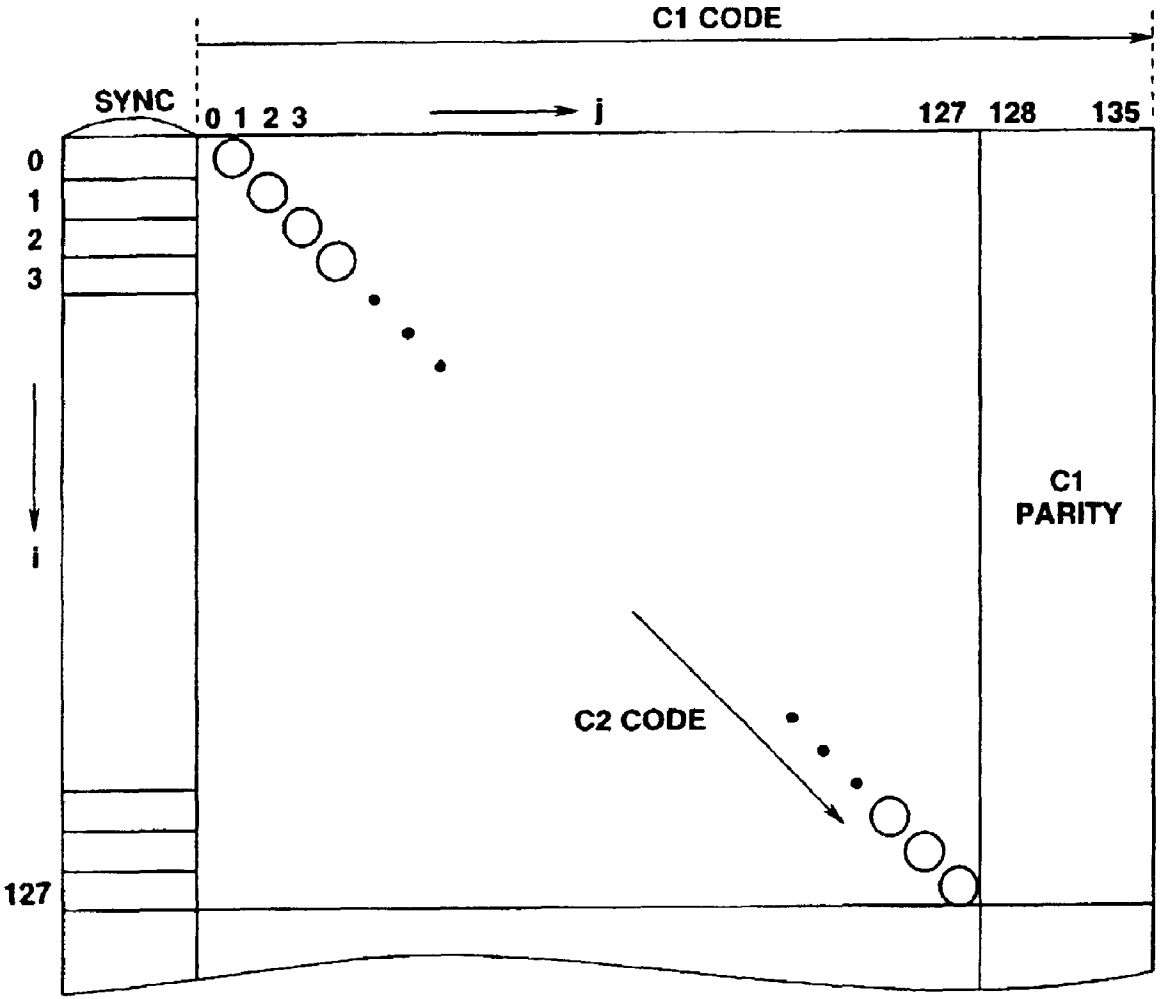
FIG. 18 is a schematic representation of the long distance error correction code format used with the present invention.
Figure 19:
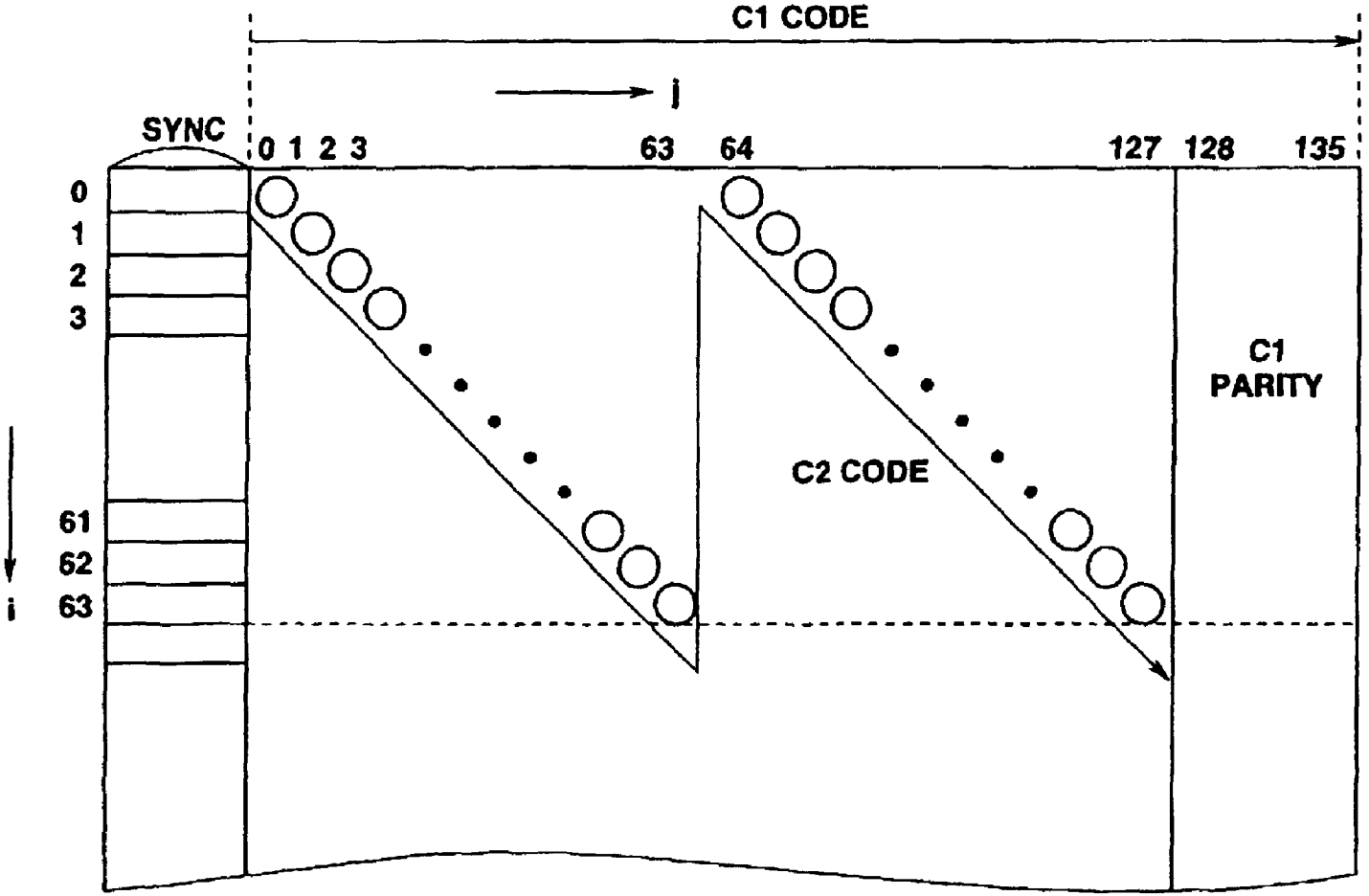
FIG. 19 is a schematic representation of a short distance error correction code format that could be used with the present invention.

In the preferred embodiment of the ECC encoding technique, a long distance code, also known as the L format, is use. The L format results in C1 code words that are arranged as shown in FIG. 18, described further below. If desired, the ECC-encoded data may exhibit a short distance code or S format, such as is depicted in FIG. 19, described below. Depending upon whether the L format or the S format is selected, system controller 110 controls memory controller 113 such that the read and write operations of memory 131 permit the data bytes to be ECC encoded in either the L format or the S format.

Modulator 140 serves to converts 8-bit bytes supplied thereto from memory 131 into 16-bit symbols. Each symbol is run length limited (RLL), as will be described. It will be appreciated that, by generating 16-bit symbols, the accumulated digital sum value (DSV), which is a function of the run length of the digital signal, that is, the number of consecutive 0s or the number of consecutive 1s, is limited to permit the DC component which is produced as a function of such consecutive 0s or 1s, to remain at or close to 0. By suppressing the DC, or lower frequency component of the digital signal that is recorded, errors that otherwise would be present when that digital signal is reproduced are minimized.

Modulator 140 thus produces a recording signal which is coupled to cutting apparatus 150. This apparatus is used to make an original disk from which one or more mother disks may be produced and from which copies may be stamped for distribution to end users. That is, such stamped disks constitute the CD ROMs.

In one embodiment, the cutting apparatus includes an electro-optical modulator 151 which relies upon the so-called Pockels effect to modulate a light beam that is used to "cut" an original disk. This original disk is used by a mastering apparatus 160 to produce a master of the original disk. The mastering apparatus relies upon conventional techniques, such as development and vacuum deposition, to produce a plurality of mother disks. Such mother disks are used in stompers which ejection mold copies that subsequently are packaged and distributed. Blocks 171 and 172 in FIG. 1 are intended to represent the injection molding and packaging apparatus in manufacturing such disks. The completed disk is depicted as disk 100.

The technique used to reproduce the information recorded on optical disk 100 now will be described in conjunction with the block diagram shown in FIG. 2. Here, the disk is optically read by an optical pickup 212 which projects a light beam, such as a laser beam having the spatial frequency $l=\lambda/2na$, this beam being reflected from the disk and detected by a conventional pickup detector. The detector converts the reflected light beam to a corresponding electrical signal which is supplied from pickup 212 to a waveform equalizer 213 and thence to a phase locked loop clock reproducing circuit 214 and to a demodulator 215. Transitions in the recovered electrical signal are used to synchronize the phase locked loop to extract therefrom the clock signal which was used to record data on the disk. The extracted clock is coupled to demodulator 215 which performs RLL demodulation that is described in greater detail below in conjunction with FIG. 31. Suffice it to say that if data is recorded on disk 100 as 16-bit symbols, demodulator 215 demodulates each 16-bit symbol to an 8-bit symbol or a byte.

The demodulated data reproduced from disk 100 is supplied to a ring buffer 217. The dock signal extracted by phase locked loop clock reproducing circuit 214 also is supplied to the ring buffer to permit the "clocking in" of the demodulated to data. The demodulated data also is supplied from demodulator 215 to a sector header detector 221 which functions to detect and separate the sector header from the demodulated data.

Ring buffer 217 is coupled to an error correcting circuit 216 which functions to correct errors that may be present in the data stored in the ring buffer. For example, when data is recorded in the long distance code formed of, for example, C1 code words, each comprised of 136 symbols including 116 symbols representing data (i.e. C2 data), 12 symbols representing C2 parity and 8 symbols representing C1 parity, error correcting circuit 216 first uses the C1 parity symbols to correct errors that may be present in the C1 word. A corrected C1 word is rewritten into ring buffer 217; and then the error correcting circuit uses the C2 parity symbols for further error correction. Those data symbols which are subjected to further error correction are rewritten into the ring buffer as corrected data. Reference is made to aforementioned U.S. Pat. No. RE 31,666 for an example of error correction.

In the event that an error in the sector header is sensed, error correcting circuit 216 uses the C1 parity symbols to correct the sector header, and the corrected sector header is rewritten into a sector header detector 221. Advantageously, the C2 parity symbols need not be used for sector header error correction.

As mentioned above, the input data symbols supplied four error correction encoding exhibit a given sequence, but the error correction encoded symbols are rearranged in a different sequence for recording. In one arrangement, the odd and even symbols are separated and the odd symbols of a C1 code word are recorded in an odd group while the even symbols of that C1 code word are recorded in an even group. Alternatively, odd and even symbols of different C1 code words may be grouped together for recording. Still further, other sequential arrangements may be used to record the data. During playback, error correcting circuit 216 and ring buffer 217 cooperate to return the recovered data symbols to their original, given sequence. That is, the data symbols may be thought of as being recorded in a disarranged order and the combination of the error correcting circuit and ring buffer operate to rearrange the order of the symbols in a C1 code word to its properly arranged sequence.

Error corrected data stored in ring buffer 217 is coupled to error detecting circuit 222 which uses the EDC bits added to the recorded data by EDC adder 127 (FIG. 1) to detect an uncorrectable error. In the event that data cannot be corrected, EDC detector 222 provides a suitable indication, such as an error flag in a particular uncorrectable byte or an error flag in an uncorrectable C1 code word, and the error corrected data, either with or without such error flags, as the case may be, is coupled to output terminal 224.

In addition, TOC information that is recovered from disk 100, after being error corrected by error correcting circuit 216 and error detected by EDC detector 222, is coupled to a TOC memory 223 for use in controlling a data playback operation and for permitting rapid access to user data. The TOC information stored in memory 223, as well as sector information separated from the reproduced data by sector header detector 221 are coupled to a system controller 230. The system controller responds to user-generated instructions supplied thereto by a user interface 231 to control disk drive 225 so as to access desired tracks and desired sectors in those tracks, thereby reproducing user data requested by the user. For example, the TOC information stored in TOC memory 223 may include data representing the location of the beginning of each track; and system controller 230 responds to a user-generated request to access a particular track to control disk drive 225 such that the requested track is located and accessed. Particular identifying information representing the data in the accessed track may be recovered and supplied to system controller 230 by sector header detector 221 so that rapid access to such data may be achieved. A further description of the TOC information and sector information useful for controlling the disk drive in the manner broadly mentioned above is discussed in greater detail below.

Figure 21:
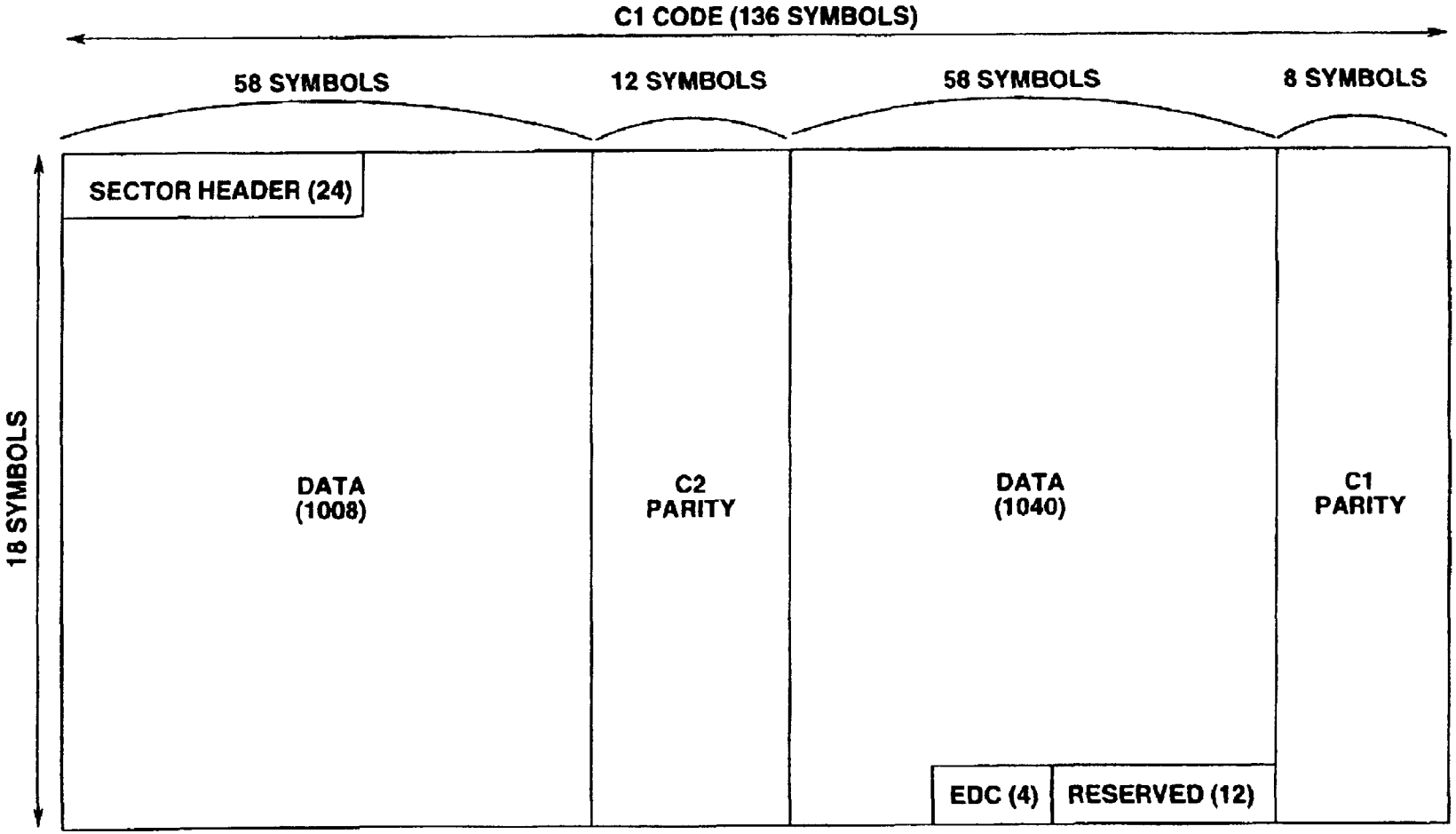
FIG. 21 is a schematic representation of a sector of data that has been error correction encoded.

It will be appreciated from the ensuing discussion of FIGS. 10 and 21 that sector header information that is recovered from the disk may be error corrected by using the C1 parity symbols included in the same C1 code word as the sector header. There is a high probability that any errors that may be present in the sector header can be corrected by using the C1 parity symbols only. Since a C1 code word contains C2 parity symbols that are generated from the data symbols included in different C1 code words, sector information is quickly detected quickly by not waiting for all of the C2 parity symbols to be assembled before correcting the sector header. Thus, position information of a sector, which is included in the sector header as a sector address, is detected, thus facilitating rapid access to a desired sector. This is to be compared with a conventional CD-ROM wherein sector header information is interleaved in several C1 code words, thus requiring the recovery and error correction of all of those C1 code wards before the sector header data can be assembled and interpreted.

Figure 3:
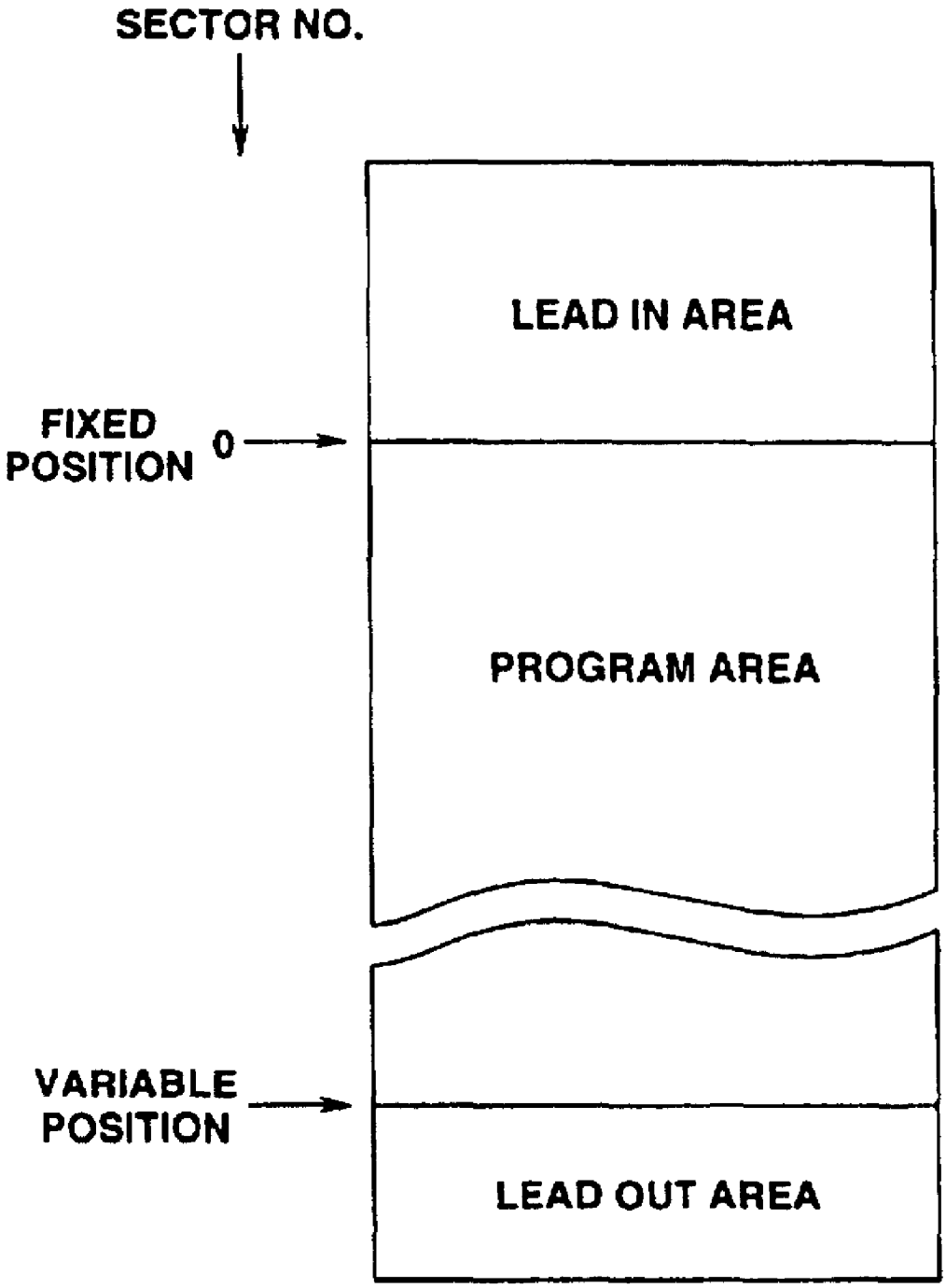
FIG. 3 is a schematic representation of the recording areas for the disk made by the technique shown in FIG. 1.

FIG. 3 is a schematic representation of the manner in which the recording surface of disk 100 is divided into separate areas, referred to as the lead-in area, the program area and the lead-out area. FIG. 3 also identifies the lead sector addresses of the program area and the lead-out area. In the illustrated embodiment, the sectors included in the lead-in area exhibit negative sector addresses ending with the sector address −1 which, in hexadecimal notation is 0xFFFFFF. The sector address of the first sector in the program area is identified as address 0. As indicated, the length or duration of the program area is dependent upon the amount of data recorded therein and, thus, the address of the last sector recorded in the program area is variable. It is appreciated, therefore, that the first sector address of the lead-out area is variable and is dependent upon the length of the program area.

Figure 4:
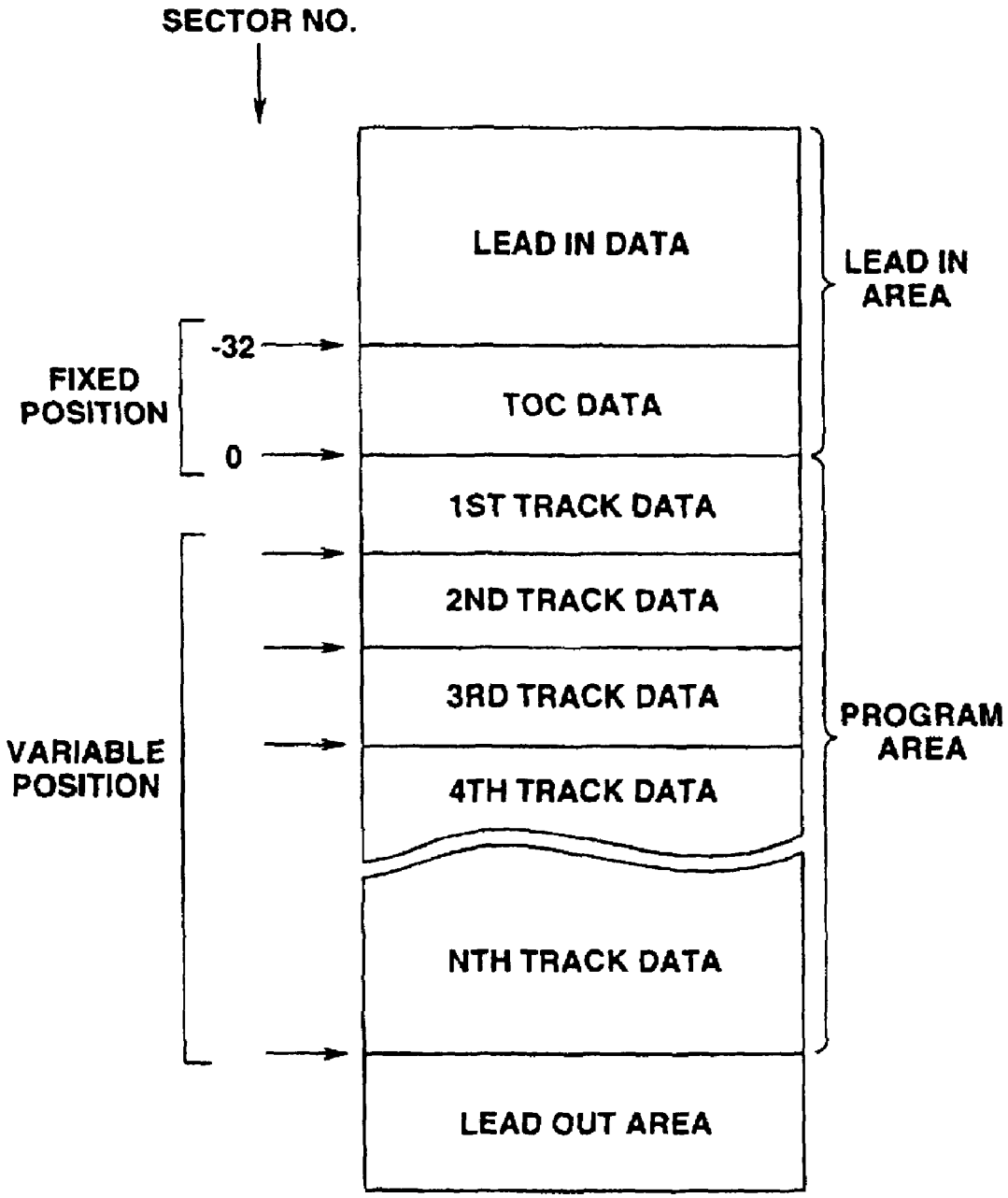
FIG. 4 is a schematic representation showing the recording areas of FIG. 3 in greater detail.

One embodiment of the disk configuration shown broadly in FIG. 3 is schematically illustrated in FIG. 4. Here, the TOC region, which is comprised of one or more TOC tracks, is disposed in the lead-in areas and TOC information is recorded in sectors identified as −32 to −1. These 32 sectors of TOC information occupy a fixed position, such as a single TOC track, in the lead-in area. The program area shown in FIG. 4 is comprised of N tracks, where N is variable. The sector address of the first track of the program area is identified as address 0; and the total number of tracks included in the program area is dependent upon the amount of information stored on the disk, and since the number of sectors included in each track likewise is variable, the sector addresses of the lead sectors of tracks 2, 3, . . . N are variable. Of course, the lead-out area commences after the Nth track is recorded.

In one embodiment, the data recorded on a given disk may admit of different applications. However, it is preferred that all of the data recorded in a respective track admit of the same application.

Figure 5:
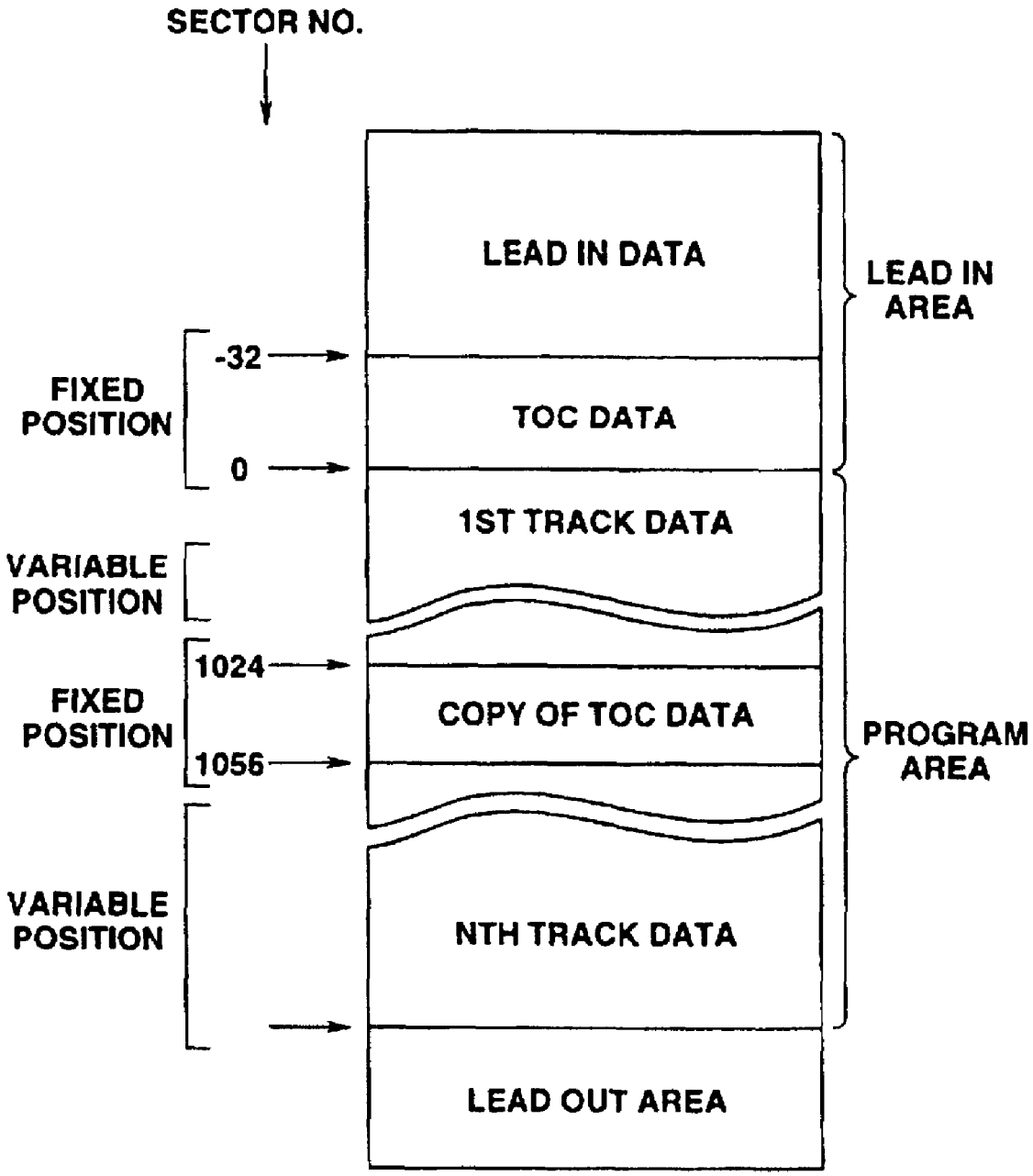
FIG. 5 is a schematic representation of another format of the recording areas.

FIG. 5 illustrates another disk configuration wherein TOC information is recorded in the lead-in area from, for example, sector −32 to sector −1, as was the case in FIG. 4, and a copy of the TOC information is recorded in the program area. In the example shown in FIG. 5, the copy of the TOC information is recorded in at least one track whose lead sector is, for example, sector number 1024. Since the size of the TOC region is fixed at 32 sectors, as will be described, the last sector of the copied TOC region is sector 1055; and the lead sector of the next-following user data track is identified as sector 1056. One reason for providing a copy of the TOC information in the program area is that some computer applications do not easily recognize data recorded in sectors having negative addresses (such as sectors −32 to −1 of the TOC information recorded in the lead-in area).

Figure 6:
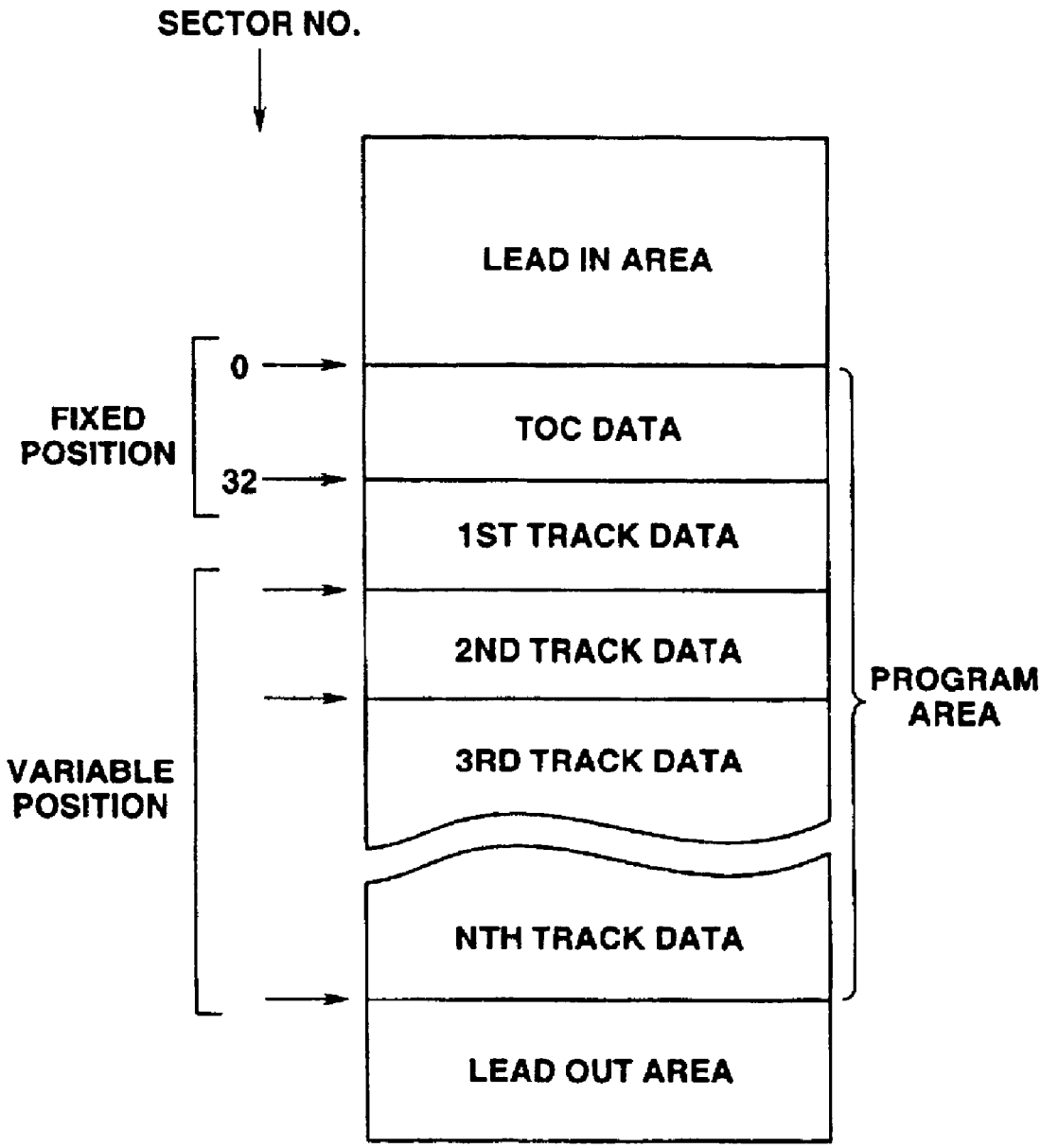
FIG. 6 is a schematic representation of still another format of the recording areas.

Still another embodiment of the data configuration recorded on the optical disk is illustrated in FIG. 6, wherein the TOC region is provided in the program area at sectors 0 to 31. Here, the recording of TOC information in the program area differs from the recording of TOC information in the program area of FIG. 5 in that the FIG. 6 arrangement does not include a copy of the TOC information. Nevertheless, since the TOC information is recorded in positive sector addresses in FIG. 6, the possibility of misinterpretation due to the difficulty of recognizing negative sector addresses by a computer is obviated.

Figure 7:
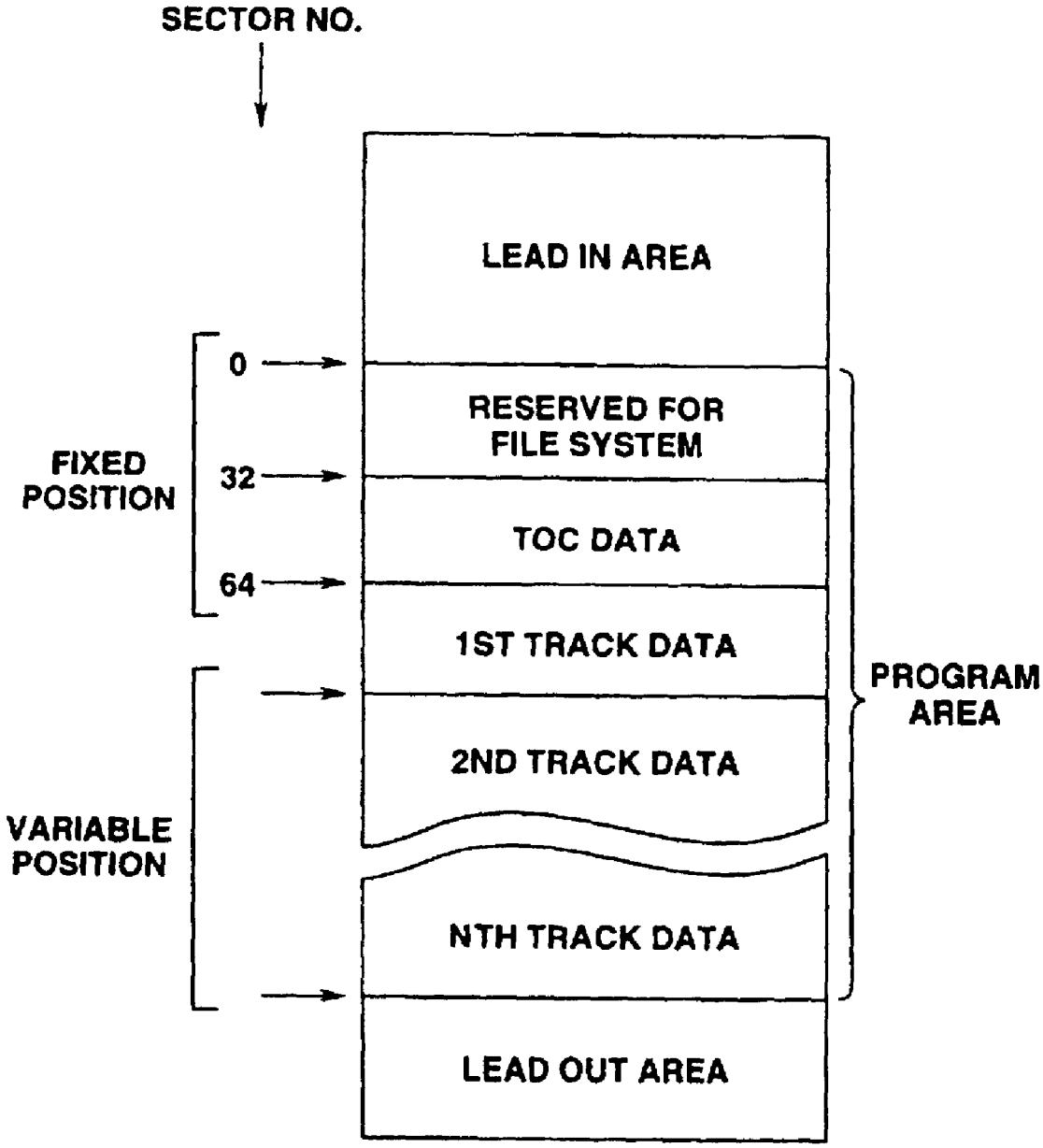
FIG. 7 is a schematic representation of yet another format of the recording areas.

In the embodiments of FIGS. 5 and 6 wherein TOC information is recorded in the program area, it is appreciated that the TOC region is segregated from data files which are particularly relevant to the computer with which the optical disk is to be used. FIG. 7 illustrates a still further example of the data configuration recorded on the optical disk and illustrates the TOC region to be located from sector address 32 to sector address 63. In this arrangement, information recorded in sectors 0 to 31 is reserved for computer files that are particularly applicable to the computer system with which the optical disk is to be used. Thus, in the embodiments of FIGS. 5, 6 and 7 wherein TOC information is recorded in the program area, such TOC information is segregated from and, thus, does not interfere with file system data that may be recorded on the disk. Such file system data may occupy several sectors or several tens of sectors; and since the TOC information is recorded in a fixed number of sectors so as to occupy a fixed TOC region, there is no interference by the TOC information with such file system data.

As mentioned above, in the preferred embodiment TOC information is recorded in 32 sectors. Preferably, although not necessarily, each sector is comprised of 2048 bytes and an example of the TOC information recorded in a TOC region is set out in the following Table 1.

TABLE 1

Table of Contents Information

| Field Name | Bytes |
|---|---|
| Disc Information | 2048 |
| Track information (1-st Track) | 32 |
| Track Information (2-nd Track) | 32 |
| Track Information (3-rd Track) | 32 |
| . | |
| . | |
| . | |
| Track Information (N-th Track) | 32 |
| Reserved | 63488-32N |
| TOTAL | 65536 |

From the foregoing table, it is appreciated that the TOC information includes one sector dedicated to disk information, described more particularly with respect to Table 2, and up to 31 sectors in which track information (see Table 3) is recorded. The TOC region also includes a reserved area for the recording of information that may be useful in the future. In a practical adaptation of the optical disk of the present invention, user information may be recorded in N tracks where, for example, N=256. The track information which is recorded in the TOC region relates to the data that is recorded only in a corresponding track, as will be described in conjunction with Table 3.

The data which constitutes the disk information recorded in the TOC region is shown in the following Table 2:

TABLE 2

Disk Information

| Field Name | Byte(s) |
|---|---|
| HD-CD ID | 8 |
| Disk Type | 1 |
| Reserved for Disk Size | 1 |
| Lead Out Sector Address | 3 |
| Reserved for Multi Session Parameters | 20 |
| Reserved for Writable Parameters | 20 |
| Volume Number | 1 |
| Total Volume Number | 1 |
| Catalog Number | 16 |
| Reserved for Application ID Strings | 8 |
| Disk Title in English/ISO646 | 16 |
| Local Language Country Code | 3 |
| Length of Disk Title in Local Lan. (=N) | 1 |
| Disk Title in Local Lang. | N |
| First Track Number | 1 |
| No. of Track Entry | 1 |
| Reserved | 1947-N |
| TOTAL | 2048 |

The fields which identify the disk information are described more particularly as follows:

HD-CD ID

This field, comprised of 8 bytes, contains a character string that identifies the data structure recorded on the disk, including the data structure which is used to represent TOC information, the data structure used to represent track information and the data structure of a sector. For example, if the character string is "HD-CD001", the data structure recorded on the disk is of the type illustrated in FIG. 4, the data structure used to represent TOC information is as shown in Table 1, the data structure used to represent track information is as shown in Tables 2 and 3 and the data structure of the sectors of, for example, the user data tracks, is as shown in Table 4 (to be described). Different data structures may be identified by the character string "HD-CD002", "HD-CD003", etc. The particular character string which is recorded in this field is detected by the reproducing apparatus which permits proper interpretation of the played back data consistent with the sensed data structure.

Disk Type

This 1-byte data identifies the type of disk as, for example, a read only disk, a write once read many (WORM) disk or an erasable disk (such as the writable optical disk known as the "Mini" disc).

Reserved For Disk Size

This 1-byte field is used to identify the size of the optical disk. For example, a disk diameter of 120 millimeters may be identified by a byte whose value is "1", a disk whose diameter is 80 millimeters may be identified by a byte whose value is "2", and so on. In addition or, alternatively, this field may be used to identify the storage capacity of the disk.

Lead Out Sector Address

This 3-byte field identifies the address of the first sector in the lead-out area Reserved For Multisession and Writable Parameters These two-fields, each formed of 20 bytes, store information which is particularly useful for erasable disks or for WORM disks and is not further described herein.

Volume Number

This 1-byte data field is used when several disks constitute a collection of data for a particular application. For example, if the collection includes 2, 3, 4, etc. disks, this field identifies which one of those disks is the present disk.

Total Volume Number

This 1-byte field identifies the total number of disks which constitute the collection in which the present disk is included.

Catalog Number

This 16-byte field is used to identify the type of information or program that is recorded on the disk. Such identification constitutes the "catalog number" and is represented as UPC/EAN/JAN code presently used to identify various goods.

Reserved For Application ID Strings

This 8-byte field is intended to identify the particular user application for this disk medium. At present, this field is not used.

Disk Title In English/ISO646

This 16-byte field stores the title of the disk in the English language, as represented by the ISO646 standard. Although the actual title of the disk may be in another language, its English translation or a corresponding English identification of that title is recorded in this field. In other embodiments, the field may contain a lesser or greater number of bytes so as to accommodate English titles of lesser or greater length.

Local Language Country Code

This 3-byte field is intended to identify the actual language of the title of the disk. For example, if the actual title of the disk is in Japanese, this field records the "local language country" as Japan. If the title is in French, this field records the "local language country" as France. The code recorded in this field may exhibit a numerical value corresponding to a particular country or, alternatively, the field may be as prescribed by the ISO3166 standard. If it is desired not to utilize this field, the character string recorded therein may be 0xFFFFFF.

Length of Disk Title in Local Language

This 1-byte field identifies the number of bytes that are used in the "Disk Title In Local Language" field (to be described) to represent the title of the disk in the local language. If the actual disk title is not recorded in a language other than English, the "Disk Title In Local Language" field is left blank and the numerical value of this "Length Of Disk Title In Local Language" field is 0.

Disk Title In Local Language

This N-byte field represents the actual title of the disk in the local language. It is expected that different languages will adopt different standards to represent disk titles, and such local language standards are expected to be used as the data recorded in this field. It is appreciated that the number of bytes which constitute this field is variable.

First Track Number

This 1-byte field identifies the number of the track which constitutes the first track that contains user information. For example, if the TOC information is recorded in a single track, and if this single track is identified as track 0 in the program area, then the number of the track which constitutes the "First Track Number" is 1.

Number of Track Entries

This 1-byte field identifies the total number of user tracks that are recorded. It is appreciated that if this field contains a single byte, a maximum of 256 user data tracks, that is, tracks which contain user information, may be recorded.

The data recorded in the track information fields of the TOC data shown in Table 1 now will be described in conjunction with the following Table 3:

TABLE 3

Track Information

| Field Name | Byte(s) |
|---|---|
| Track Number | 1 |
| ECC Type | 1 |
| Speed Setting | 1 |
| Start SA | 3 |
| End SA | 3 |
| Time Code at Start Point | 4 |
| Playing Time | 4 |
| Mastering Date & Time | 7 |
| Reserved for Application ID Strings | 8 |
| TOTAL | 32 |

The information recorded in each of the fields which constitute the track information of Table 3 now will be described in greater detail.

Track Number

This 1-byte field identifies the number of the track represented by this track information. Since one byte is used to identify the track number, it is appreciated that a maximum of 256 user data tracks may be recorded. Of course, a single track number is used to identify a respective track, and no two tracks on this disk are identified by the same track number. Although it is preferred that the successive tracks are numbered sequentially, it also is appreciated that, if desired, each track may be assigned a random number and this random number is identified by the "Track Number" field.

ECC Type

This 1-byte data identifies the error correction code which is used to encode the user data recorded in this track. For example, the ECC type may be either long distance error correction code, known as the L format, or short distance error correction code, known as the S format. The difference between the L format and the S format is described below.

Speed Setting

This 1-byte data identifies the data transfer rate by which data is recovered from this track. For example, if a reference data transfer rate is 1.4 Mbps, the "Speed Setting" field may exhibit a value representing 1× this reference rate or 2× the reference rate or 4× the reference rate or 6× the reference rate. FIG. 8 is a tabular representation of this "Speed Setting" field; and it is appreciated that the data transfer rate need not be an integral multiple of the reference data transfer rate, as represented by the value "FF". The byte value 0 for this field, as shown in FIG. 8, represents that real time read-out of data is not required. It is appreciated that computer data, as opposed to, for example, video data, does not require real time read-out. Hence, if computer data is recorded in the track identified by the "Track Number" field in Table 3. the value of the "Speed Setting" field is set to 0.

Start and End Sector Addresses (SA)

These 3-byte fields identify the address of the start sector of the track identified in the "Track Number" field and the address of the end sector of that track Since the number of sectors included in a track is variable, the start and end sector addresses of a given track are not fixed. Hence, these fields are useful when carrying out a high speed access operation of a desired track.

Time Code At Start Point

This 4-byte field identifies a time code for the start sector in the track identified by the "Track Number" field. It will be appreciated that if the user information represents video data, such video data may be recorded with conventional time codes and the start sector of the track which contains such video data is recorded in this "Time Code At Start Point" field. If time codes are not recorded with the user information, this field may be left blank or may be provided with no data, such as the character code 0.

Playing Time

This 4-byte data represents the overall playback time for the program information that is recorded in the track identified by the "Track Number" field. For example, if the user information in this track is an audio program, the playing time for this track may be on the order of about 10 minutes. If the user information constitutes compressed video data, the playing time may be 2 or 3 or even up to 15 minutes.

Mastering Date and Time

This 7-byte field identifies the date and time of creation of the master disk from which this optical disk was made. FIG. 9 is a tabular representation of this field. If desired, this field may be replaced by null data represented by character code 0.

Reserved For Application ID Strings

This 8-byte field is intended to store information representative of the particular application for which the data record in the track identified by the "Track Number" field is to be used. This differs slightly from the "Application ID" field in Table 2 because the Table 2 field is intended to identify the type of application or use intended for the entire disk, whereas the "Application ID" field of Table 3 simply the identifies the type or use of the data recorded in a particular track on that disk.

Referring now to FIG. 10, there is illustrated a preferred embodiment of the data structure of a sector of user information. TOC information also is recorded in sectors, and the structure of such TOC sector is similar. The following Table 4 identifies the fields of the sectors shown in FIG. 10:

TABLE 4

| Sector Construction | |
|---|---|
| Field Name | Byte(s) |
| Sector Sync | 4 |
| CRC | 2 |
| Subcode | 5 |
| Pos-in-Cluster | 1 |
| Address | 3 |
| Mode | 1 |
| Sub-Header | 8 |
| User Data | 2048 |
| EDC | 4 |
| Reserved | 12 |
| TOTAL | 2088 |

It is seen that a sector is comprised of a sector header which contains 24-bytes arranged as shown in FIG. 10, followed by 2.048 bytes of user data, 4-bytes of error detection code (EDC) and 12-bytes which are reserved. Preferably, a number of sectors constitute a "cluster", and as one example, a cluster is comprised of 8 sectors or 16 sectors, as may be determined by the preferred format.

A more detailed explanation of the different fields which constitute the sector shown in FIG. 10 now will be provided.

Sector Sync

This 4-byte field is formed of a predetermined bit pattern which is readily detected and which is unique and distinctive from the data pattern included in any other field of a sector. The accurate detection of the sync pattern may be confirmed sensing errors which are interpretated from the information reproduced from the sector. If a large number of errors are detected continually, it is safely assumed that the sync pattern has not been accurately sensed. Alternatively, and preferably, the demodulator which is used to convert 16-bit symbols to 8-bit bytes (or, more generally, to convert an m-bit symbol to an n-bit byte) may include suitable conversion tables which are not operable to convert the sync pattern to a byte. The sync pattern is assumed to be present when the demodulator is unable to find an n-bit byte which corresponds to a received m-bit symbol.

Cyclic Redundancy Code (CRC)

This 2-byte field is derived from the subcode data, the cluster position data and the sector address and mode data included in the sector header. Such CRC data is used to correct errors that may be present in these fields.

Subcode

This 5-byte field is described below.

Cluster Position

This 1-byte field identifies the particular order in the cluster in which this sector is located. For example, if the cluster is formed of a 8 sectors, this field identifies the particular sector as the first, second, third, etc. sector in the cluster.

Address

This 3-byte field constitutes the unique address for this sector. Since the address is represented as 3-bytes, a maximum of 64K sectors theoretically may be recorded. FIGS. 4–7 represent the sector addresses of different user data tracks.

Mode and Sub-Header

These fields are conventionally used in CD-ROMs and the data represented here is the same as that conventionally used in such CD-ROMs.

User Data 2,048 bytes of information are recorded in the user data field. For example, computer data compressed video data, audio data and the like may be recorded. If video data is recorded, the MPEG standard may be used to compress that data as described in standard ISO1381-1.

Error Detection Code

This 4-byte data is cyclic code which is added by EDC adder 127 (FIG. 1) and is used to enable the detection of an uncorrectable error in the sector.

A detailed discussion of the sub-code field now is provided in conjunction with FIGS. 11A–11E. It is appreciated that the sub-code field is comprised of two portions: a 1-byte address portion and a 4-byte data portion. The value of the address portion serves to identify the type of data that is recorded in the data portion. For example, and as shown in FIG. 11A, if the value of the address portion is 0, null or zero data is recorded in the data portion.

If the value of the address portion is 1, as shown in FIG. 11B, the data portion is provided with the following 1-byte information:

Track Number

This data identifies the number of the track in which the sector containing this sub-code is recorded.

Copyrighted

This byte exhibits the structure shown in FIG. 12 wherein a "1" bit represents that copying of the associated user data is prohibited and a "0" bit indicates that copying of the associated data is permitted. The bit positions of the copyright byte identify the type of user data for which copying is selectively prohibited or permitted. As shown in FIG. 12, the identified user data is analog video data, analog audio data, digital video data, digital audio data, and the like. For example, if the user data in this sector is digital video data and if copying of that digital video data is prohibited, the copyright byte may appear as "00100000".

Application ID

This indicates the particular application intended for the user data that is recorded in this sector. Examples of typical applications are shown in FIG. 13 as computer text, video, video/audio, etc. If no data is recorded in this sector, the application ID byte may be represented as the character 0.

ECC Type

This data indicates whether the user data is ECC encoded in, for example, the L format or the S format, as shown in FIG. 16. Other types of ECC codes may be represented by other values of this ECC type byte.

If the value of the sub-code address is 2, as represented in FIG. 11C, the data portion represents time code. That is, if the user data recorded in this sector is variable over time, as would be the case if such data is video data, the time code data recorded in the sub-code field represents time information at which the user data is recorded. An example of such time code data is represented in FIG. 14. It is appreciated that 2-digit BCD bits are used to represent the hour, minute, second and frame at which the user data in this sector is recorded.

If the value of the address portion is 3, as depicted in FIG. 11D, the data portion of the sub-code field represents the distance from the sector in which this sub-code field is recorded to the first sector in which an immediately preceding I compressed video picture is recorded; and also the distance from this sector to the first sector in which the next-following I compressed video picture is recorded. Those of ordinary skill in the art will recognize that video data, when compressed in accordance with the MPEG standard, may constitute an intraframe encoded video picture, typically known as an I picture, a predictive coded video picture, typically known as a P picture, and a bi-directionally predictive coded video picture, typically known as a B picture. The data portion of the sub-code field whose address portion has the value of 3 thus indicates the distances between this sector and the beginning of the next-preceding and next-following I pictures.

If the value of the address portion is 4, as shown in FIG. 11E, the data portion includes 1-byte picture type, indicating whether the video picture that is recorded in this sector is an I, P, or B picture (see FIGS. 15), and 2-byte temporal reference data which indicates the location in the original picture display sequence of the particular picture that is recorded in this sector. This temporal reference data is helpful during a playback operation because, as those of ordinary skill in the art recognize, the location of compressed B-picture data in the MPEG code sequence may be quite different from the actual location of that picture when the B-picture ultimately is displayed.

Figure 17:
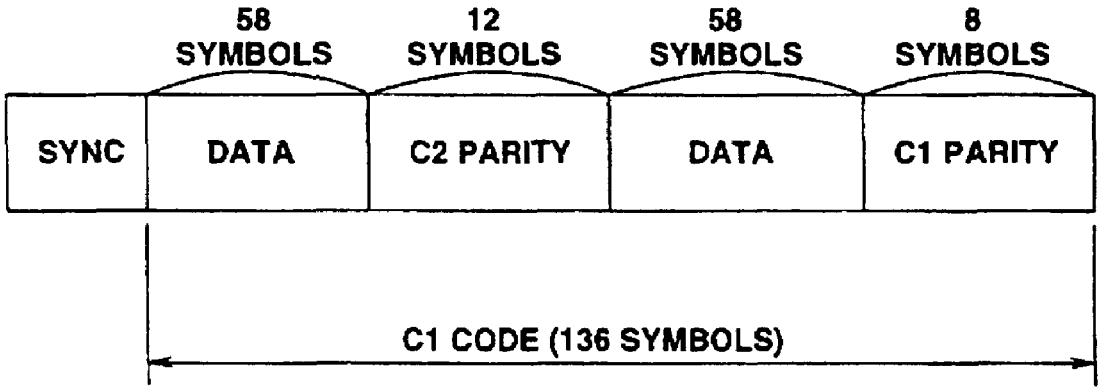
FIG. 17 is a schematic representation of one frame of error correction encoded data, identified as a C1 code word.

The ECC format which preferably is used with the present invention is the L format. A schematic representation of an encoded "data frame" is depicted in FIG. 17. The ECC "frame" is referred to herein as a C1 code word and this word when recorded, consists of a sync pattern followed by 136 data symbols. The term "symbol" is used rather than "byte" because, as will be described, the recorded "symbol" consists of 16 bits (known as channel bits), whereas a byte typically is understood to consist of only 8 bits. It is appreciated, however, that the C1 code word, prior to conversion from 8-bit bytes to 16-bit symbols, that is, prior to modulation of the C1 code word, nevertheless consists of the construction shown in FIG. 17, wherein it will be understood that the illustrated symbols are, in fact, bytes.

The manner in which the C1 code word structure is generated now will be briefly described, 116 data bytes, or symbols, known as a C2 word, are supplied to, for example, the ECC encoder formed of memory 131 and ECC circuit 132 of FIG. 1. A C2 hold section is added to the C2 word, preferably by being inserted between two groups of 58 symbols, and a C1 hold section is added to the end of the resultant 128 symbols. A hold section merely reserves a location in the data stream in which parity data subsequently is inserted. Thus, a preliminary C1 word may be thought of as being formed of a group of 58 data symbols followed by a C2 hold section followed by a group of 58 data symbols followed by a C1 hold section. Then, C2 parity symbols are generated by, for example, modulo 2 addition. Preferably, one data symbol in one preliminary C1 word is modulo-2 combined with a data symbol included in the next (or second) preliminary C1 word. If desired, further combinations may be effected with a data symbol included in the third-following preliminary C1 word, and so on, to produce one C2 parity symbol. The next C2 parity symbol is produced by a similar combination of the next data symbol in this first preliminary C1 word with respective data symbols in the next-following preliminary C1 words. In this manner, C2 parity symbols are generated by combining a predetermined number of data symbols of the same predetermined number of successive preliminary C1 words. That is, if the C2 parity symbol is produced by modulo-2 combining two data words, then one data word of the first preliminary C1 word is modulo-2 combined with one data symbol in the next symbol position of the next-following preliminary C1 word. If the C2 parity symbol is produced by combining three data symbols, then one data symbol in successive symbol positions from each of three successive preliminary C1 words are combined to produce the C2 parity symbol. And if the C2 parity symbol is generated by combining four data symbols, than one data symbol in successive symbol positions from each of four successive preliminary C1 words are combined.

As a preferred aspect of this ECC encoding, the data symbols which are combined occupy successive positions in the respective preliminary C1 words. That is, if the data symbol in the first preliminary C1 word is the nth data symbol, the data symbol in the second preliminary C1 word is the (nth+1)th data symbol, the data symbol in the third preliminary C1 word is the (n+2)th data symbol, and so on.

When 12 C2 parity symbols are generated in the manner just described, those 12 C2 parity symbols are inserted into the C2 hold section of this first preliminary C1 word, thus forming a precursory C1 word. Then, 8 C1 parity symbols are generated by conventional parity symbol generation in response to the data and parity symbols included in this precursory C1 word. The generated C1 parity symbols are inserted into the C1 hold section thus forming the C1 code word.

In the C1 code word shown in FIG. 17, the C2 parity symbols are inserted between two groups of data symbols. Alternatively, the C2 parity symbols may be located at the end of the 116 data symbols, that is, at the end of the C2 word. A preestablished number of C1 code words having the structure shown in FIG. 17 constitute the long distance error correction encoded data. That is, a preestablished number of the C1 code words are used as the L format ECC encoded data having the structure shown in FIG. 18. As illustrated, 128 C1 code words are used, such that i=0, 1 . . . 127. Each C1 code word is comprised of a sync code, or pattern. followed by 136 symbols $S_0, S_1, \ldots S_j \ldots S_{135}$, wherein j=0, 1 . . . 135. The circles shown in FIG. 18 represent the manner in which the C2 parity symbols are generated. As has been described above, the C2 parity symbols are generated for the $C1_0$ code word in response to the data symbols included in code words $C1_0$, $C1_1 \ldots C1_r$, where r represents the number of data symbols and that are combined to generate the parity symbol. From FIGS. 17 and 18, it is seen that symbols $S_0$–$S_{127}$ constitute data and C2 parity symbols, and symbols $S_{128}$–$S_{135}$ constitute C1 parity symbols. It will be appreciated that, since twelve C2 parity symbols are recorded in a C1 code word, up to twelve data symbols can be corrected. Since these twelve data symbols are included in twelve successive C1 code words, a burst error of twelve C1 code words can be corrected, which amounts to a correctable error of 12×136=1,632 symbols.

An example of the S format ECC encoding is schematically illustrated in FIG. 19. In the S format, the twelve C2 parity symbols are divided into two groups of six C2 parity symbols each, with one group of six C2 parity symbols being added to 58 data symbols and the other group of six C2 parity symbols being added to the next 58 data symbols. Thus, rather than generating the C2 parity symbols from data symbols included in 128 C1 code words, the C2 parity symbols in the S format are generated from successive data symbols included in 64 C1 code words having the schematic representation shown in FIG. 19. Whereas the L format permits the use of C2 parity symbols to correct errors in twelve C1 code words, the S format supports C2 parity correction of up to six C1 code words. Hence, the S format permits the correction of a burst error of 6×136=816 symbols.

When compared to the ECC format used in, for example, CD-ROMs of type that have been proposed heretofore, the use of the L format or S format in accordance with the present invention permits a reduction in redundancy from about 25% of prior art CD-ROMs to about 15% in the present invention.

A sector formed of ECC encoded data in the L format or the S format is shown in FIG. 21 wherein the sector includes a sector header formed of 24 symbols and also is comprised of eighteen C1 code words, each C1 code word having the construction shown in FIG. 17. The last C1 code word included in the sector includes four error detection code symbols and twelve symbols that are reserved for future use. The sector header exhibits the structure shown in FIG. 10. Nevertheless, errors that may be present in the sector header can be corrected generally by using only the C1 parity symbols which are generated for that C1 code word.

Figure 20:
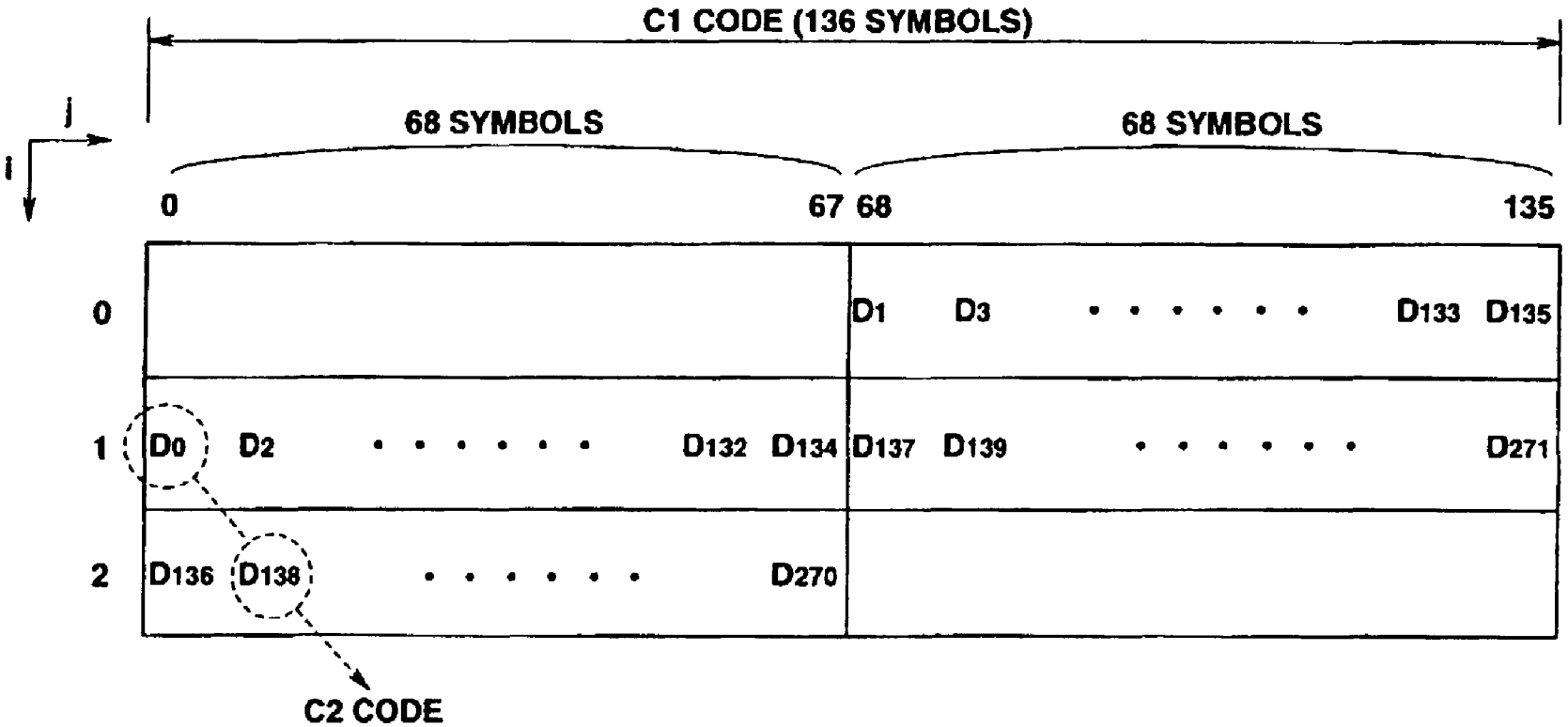
FIG. 20 is a schematic representation of the sequential order of rearranged data symbols after those symbols have been played back from the disk.

As an aspect of this invention, the sequence of the symbols included in a C1 code word as recorded in a track differs from the sequence of the symbols that are supplied for recording. That is, and with reference to FIG. 1, the sequence of the symbols supplied to modulator 140 differs from the sequence of symbols supplied to switch 124. By recording the data symbols in what is referred to herein as a disarranged order, the possibility is reduced that a burst error will destroy the data to the extent that, when reproduced, the data will not be interpretable. In particular, if the data represents video information, the recording of the data symbols in disarranged order enhances the possibility that accurate video pictures nevertheless can be recovered even in the presence of the burst error. FIG. 20 is a schematic representation of the manner in which the data symbols are disarranged for recording.

Let it be assumed that data symbols are recorded on the disk in the order $D_k$ and let it be further assumed that each C1 code word is formed of m symbols, with n of those symbols constituting a C2 code word (i.e. 116 data symbols and 12 C2 parity symbols) and m–n of those symbols constituting the C1 parity symbols. The relationship among i, j, k, m and n for recording thus is:

$$k=m\times i+2\times j-m, \text{ when } j<m/2$$

$$k=m\times i+2\times j-(m-1) \text{ when } j\geqq m/2$$

If the data symbols appear on the disk in the recorded sequence $D_0, D_1, D_2 \ldots$ such data symbols are grouped into an odd group followed by an even group. For example, and assuming 136 symbols, data symbols $D_0$–$D_{67}$ constitute an odd group of odd numbered data symbols and data symbols $D_{68}$–$D_{135}$ constitute an even group of even data symbols. It will be understood that "odd" and "even" refer to the original sequence in which those data symbols had been presented for recording. In the foregoing equations, i is the sequential order in which the C1 code words are presented for recording, j is the sequential order of the m symbols in each C1 code word presented for recording and k is the order in which the m symbols are recorded on the disk. That is, $D_j \neq D_k$.

Figure 2:
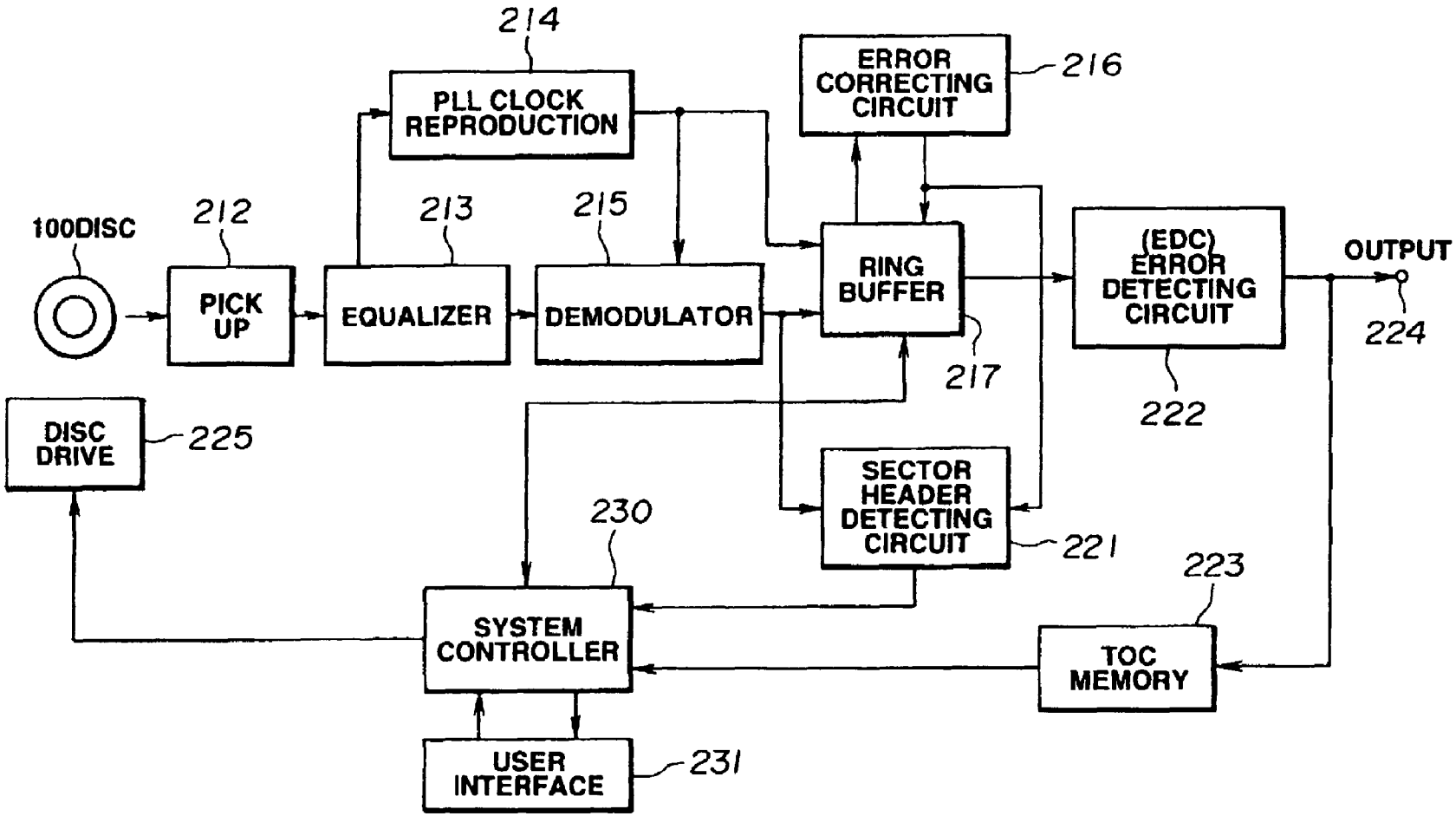
FIG. 2 is a block diagram of apparatus incorporated in the present invention for reproducing data from the optical disk that has been made in accordance with the technique shown in FIG. 1.

When the C1 code words having data symbols in the sequence $D_0, D_1, \ldots D_{135}$ are played back from the disk, the data symbols stored in ring buffer 217 of FIG. 2 are rearranged to the sequence illustrated in FIG. 20. This sequence of FIG. 20 is referred to as the arranged sequence and is formed of sequential alternating odd and even data symbols which is the same sequence as the data symbols originally presented to switch 124 of FIG. 1 for recording. It will be appreciated that the data symbols which are included in the recorded $C1_1$ code word in fact belong in part to $C1_0$ code word and the $C1_1$ code word. That is, if the $C1_1$ recorded code word is formed of symbols $D_0, D_1, \ldots D_{135}$, the reproduced $C1_0$ code word includes symbols $D_1, D_3, \ldots D_{133}, D_{135}$ and the reproduced $C1_1$ code word includes symbols $D_0, D_2, \ldots D_{132}, D_{134}$. The sequential storage positions in ring buffer 217 of FIG. 2 of the symbols $D_k$ that are reproduced from the disk may be expressed as follows:

$$i=(k/m)-(k \bmod 2)+1$$

$$j=(m/2)\times(k \bmod 2)+(k \bmod m)/2$$

where i is the sequential order of the C1 code words that are read out of the ring buffer, j is the sequential order of the sequence of the m symbols in each C1 code word that is read out of the ring buffer and k is the disarranged order in which the m symbols are recorded on the disk.

Although the present invention preferably records data in the L format of ECC encoding, the teachings herein may be employed with S format ECC encoding. Discrimination between the L format and S format may be made by sensing the ECC byte in the track information field of the TOC data, such as the ECC byte shown in Table 3, or by sensing the ECC byte included in the subcode field shown in FIG. 11B, wherein the ECC byte of the subcode field may have the structure shown in FIG. 16. Another technique that can be used for ECC format discrimination contemplates using one type of sector sync patter when L format ECC encoding is used and another type of sector sync pattern when S format ECC encoding is used. Thus, not only is sector synchronization detected but, at the same time, the type of ECC format is sensed.

Yet another technique for discriminating between L format and S format ECC encoding employs the addition of a discrimination bit immediately following the sector sync pattern.

Still another technique for discriminating between the L and S ECC formats is based upon the ability of the ECC correcting circuit 216 of FIG. 2 to operate satisfactorily. For example, if error correction assumes that the ECC encoded data is in the L format and error correction is not possible, it is highly likely that the data actually is in the S format. Conversely, if error correction assumes that the ECC encoded data is in the S format but error correction is not possible, it is highly likely that the data had been encoded in the L format. Thus, discrimination between the formats is dependent upon the success or failure of error correction.

Figure 22:
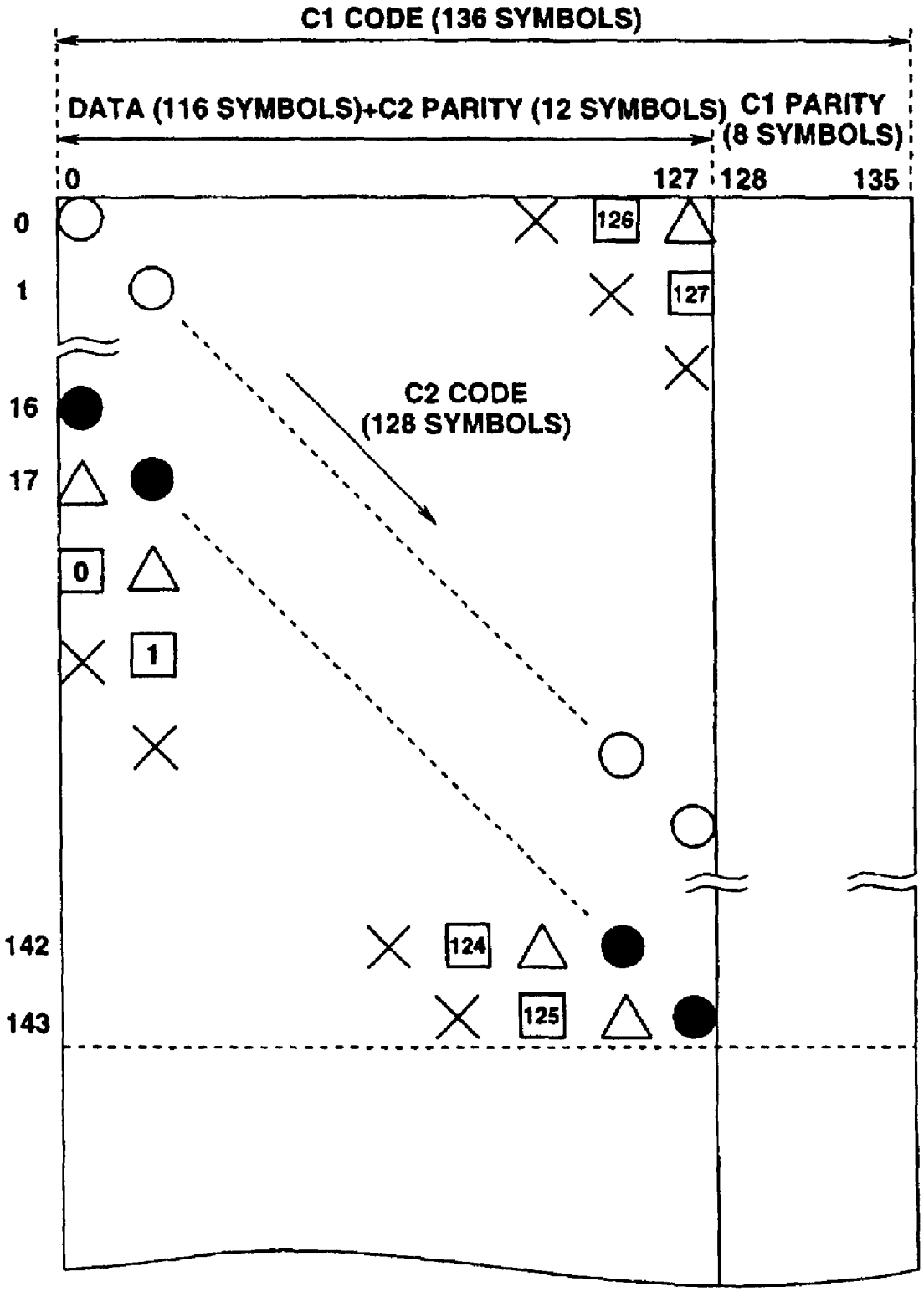
FIG. 22 is a schematic representation of a block code of error correction encoded data in the long distance format.

The ECC encoded data, whether in the L format or the S format, constitute convolution codes. A group of C1 code words may be thought of as a block and such C1 code words may be block coded in the manner shown schematically in FIG. 22. Here, in addition to L format ECC encoding, the C1 code words are block coded as will now be briefly described. Let it be assumed that the data symbols in a preliminary C1 word constitute a C2 word (as described above). Let it be assumed that the C2 words are presented in the sequence $C2_1$, $C2_2$, $C2_3$, etc. In FIG. 22, the symbols represented by an open circle are data symbols included in the $C2_0$ word, the symbols represented by a filled-in circle are data symbols included in the $C2_{16}$ word, the symbols represented by a triangle are data symbols included in the $C2_{17}$ word, the symbols represented by a square are data symbols included in the $C2_{18}$ word, and the symbols represented by an X are data symbols included in the $C2_{19}$ word. Since a block code consists of 144 C1 code words, but each C1 code word includes only 128 data symbols (including C2 parity symbols) it follows that one data symbol in the $C1_{17}$ code word cannot be included in the illustrated block and is expected to be included in the next-following block. However, block coding requires all of the data symbols in a block of code words $C1_0$–$C1_{143}$ to remain in that block and, therefore, the last data symbol of the $C1_{17}$ code word is "folded back" into this block as the last data symbol of the $C1_0$ code word. Similarly, the last two data symbols of the $C1_8$ word are expected to fall within the next-following block, but because of block coding, these two symbols, identified as data symbols 126 and 127, are folded back into the $C1_0$ and $C1_1$ code words, respectively. Stated generally, those data symbols of a C2 word which otherwise would be included in the next-following block are folded back to the beginning of the illustrated block such that each C1 code word included in a block of 144 C1 code words includes interleaved data symbols from 128 of the 144 C1 code words, as shown.

Each block consists of 8 sectors, whereby a block includes more than 16K bytes. Error correction can be carried out on a block-by-block basis.

Figure 23:
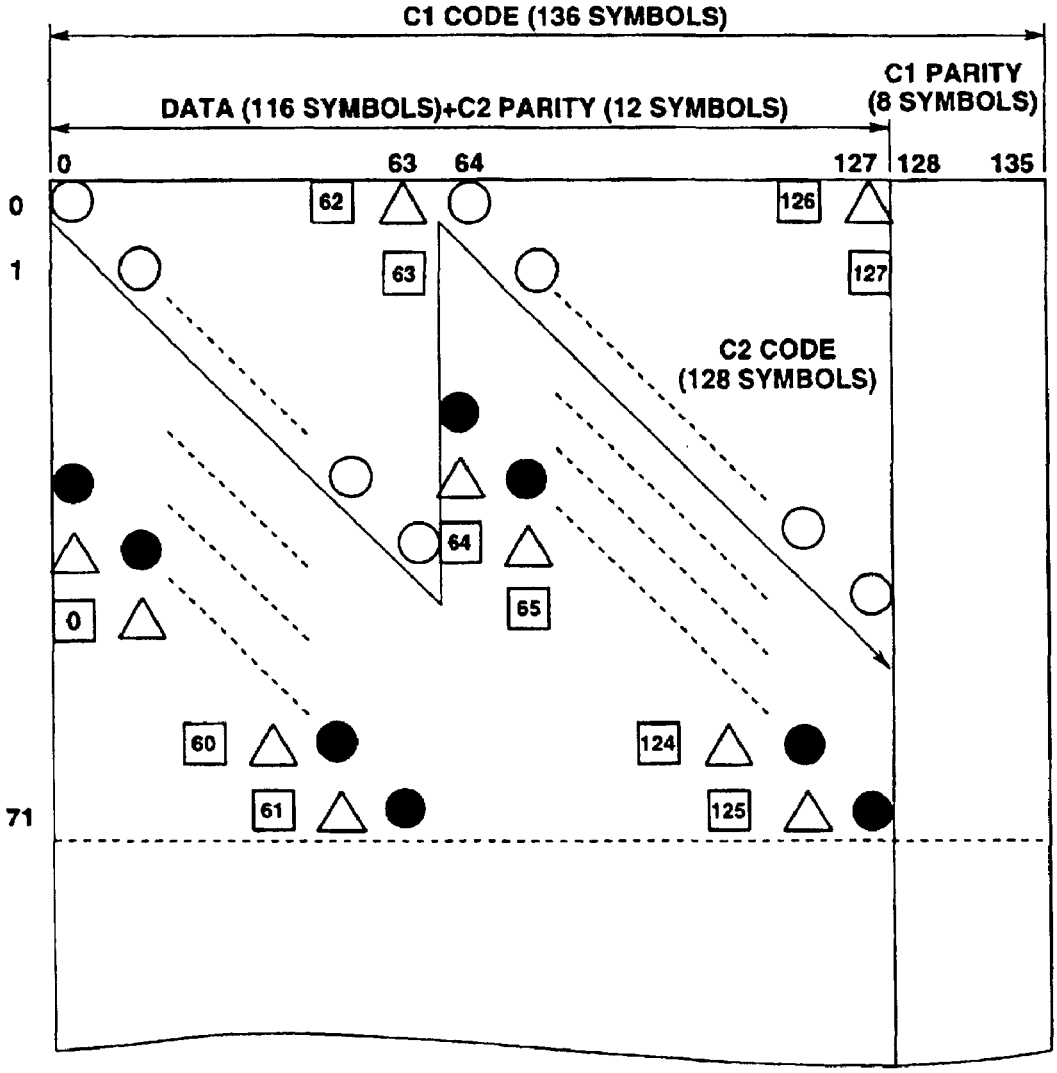
FIG. 23 is a schematic representation of a block code of error correction encoded data in the short distance format.

FIG. 23 is a schematic representation of the block coding of S format ECC encoded data. The same principle that is used for the block coding of L format ECC encoded data, as discussed in conjunction with FIG. 22, is applicable to the block coding of S format ECC encoded data. Here, however, each block consists of 4 sectors; and as a result, each block is comprised of more than 8K bytes.

The modulation technique used to modulate the C1 code words for recording on disc 100 (e.g., the modulation technique used by modulator 140 of FIG. 1) now will be described.

One type of modulation is 8-to-14 modulation (EFM) which is used as the standard in compact discs, and one example of such EFM processing is described in Japanese patent application 6-2655. In conventional EFM, an 8-bit byte is converted into a 14-bit symbol (the bits of the symbols are known as "channel" bits because they are supplied to the recording channel) and successive symbols are separated by margin bits. Heretofore three margin bits were used, and these three bits were selected to assure that the Digital Sum Value (DSV) accumulated from successive symbols is reduced. EFM is a run length limited (RLL) code and, preferably, the shortest run length permitted in EFM consists of two consecutive zeros which are spaced between is, and the longest run length is limited to 10, wherein 10 consecutive zeros may be present between is.

If two margin bits are used rather than 3, the possible combinations of such margin bits are: 00, 01, 10 and 11. In EFM, a margin bit state 11 is prohibited. Hence, only three different combinations of margin bits can be used to link (or separate) successive symbols: 00, 01 and 10. But, depending upon the bit stream of one or the other symbols which are linked by the margin bits, one or more of these possible states may be precluded because, to use the precluded state may result in an undesirable DSV.

Figure 24:
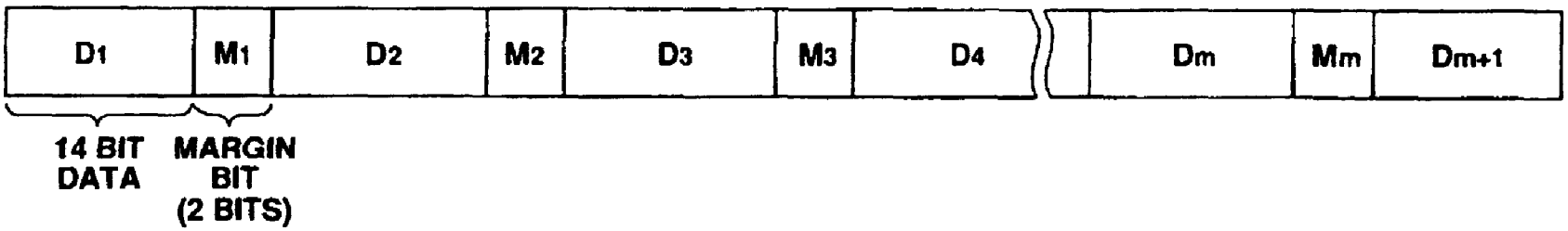
FIG. 24 is a schematic representation of a string of data symbols exhibiting EFM modulation.

FIG. 24 is a schematic representation of a "string" of data symbols separated by margin bits. Each data symbol is comprised of 14 channel bits and the margin bits are comprised of 2 channel bits. Thus, margin bits $M_1$ separate data symbols $D_1$ and $D_2$; margin bits $M_2$ separate data symbols $D_2$ and $D_3$; margin bits $M_3$ separate data symbols $D_3$ and $D_4$, and so on, with margin bits $M_m$ separating data symbols $D_m$ and $D_{m+1}$. Nevertheless, assuming that the 14 channel bits included in a data symbol are provided in 14 successive bit cells and further assuming that the margin bits are included in 2 successive bit cells, successive data transitions in the string of channel bits depicted in FIG. 24 are separated by no less than 2 data bit cells and by no more than 10 data bit cells.

Figure 27:
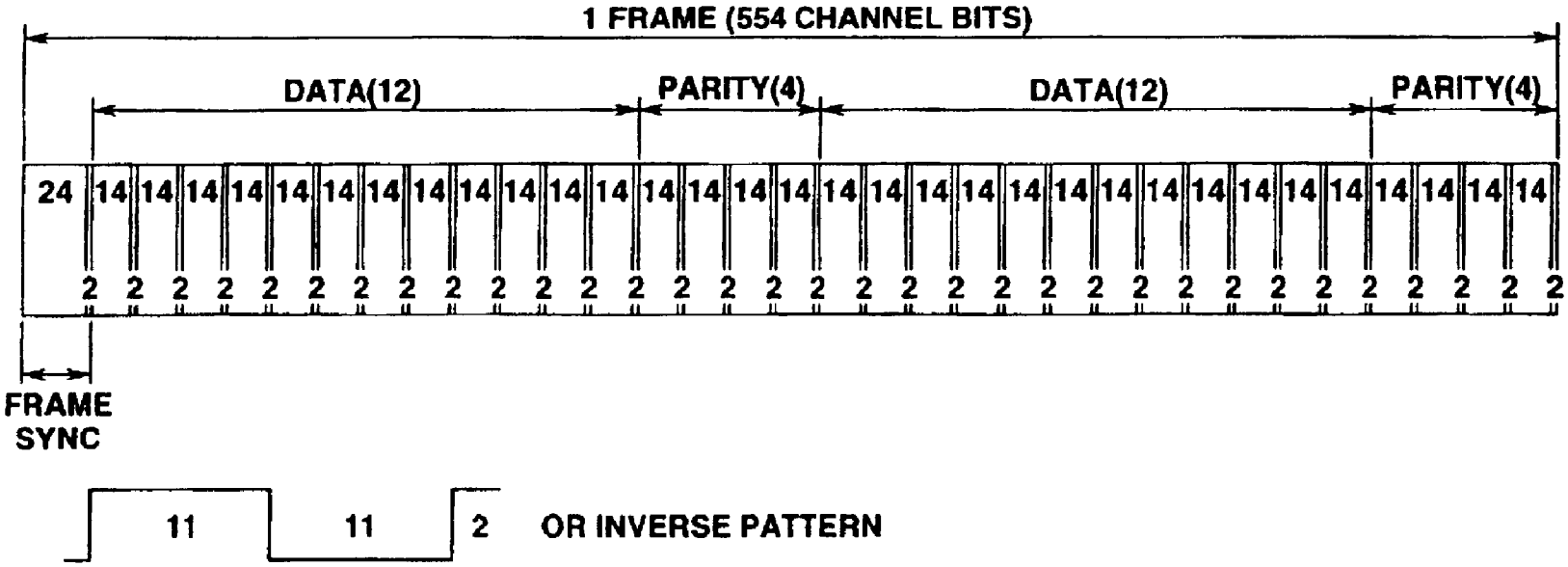
FIG. 27 is a schematic representation of a frame of EFM modulated data.

A string of data symbols may include parity symbols, and FIG. 27 illustrates a frame of such symbols beginning with a sync pattern of 24 bit cells, followed by 12 data symbols (shown as 14-bit symbols separated by 2 channel bits), followed by 4 parity symbols, followed by 12 data symbols and ending with 4 parity symbols. The sync pattern is illustrated as a high signal level extending for 11 bit cells followed by a low signal level extending for 11 bit cells, followed by a high signal level extending for 2 bit cells. The inverse of this pattern can be used FIG. 27 also depicts the two-bit margin bits which separate successive data symbols; and as mentioned above, in some instances, certain ones of as the three permitted combinations of margin bits cannot be used. FIG. 28 schematically represents the conditions under which the margin bit combination 00 or the margin bit combination 01 or the margin bit combination 10 cannot be used. As will described, a signal known as the inhibit margin bit signal M identifies the margin bit combination which cannot be used. For example, when $M_{inh}$=00, the margin bit combination 00 cannot be used. Similarly, when $M_{inh}$=01, the margin bit combination 01 cannot be used. And when $M_{inh}$=10, the margin bit combination 10 cannot be used.

Let it be assumed that margin bits separate data symbols $D_1$ and $D_2$. Let it be further assumed that the number of consecutive zeros at the leading end of data symbol $D_2$ is represented as A and the number of zeros at the terminating end of data symbol $D_1$ is B. If A+B is equal to or exceeds 8 successive zeros ($A+B \geqq 8$) then the margin bit combination 00 is inhibited ($M_{inh}$=00).

If the most significant bit C1 of data symbol $D_2$ is "1" (A=0) or if the next most significant bit C2 is "1" (A=1) or if the least significant bit C14 of data symbol $D_1$ is "1", the margin bit combination 01 is inhibited ($M_{inh}$=01).

If the least significant bit C14 of data symbol $D_1$ is "1" (B=0) or if the next least significant bit C13 is "1" (B=1), or if the most significant bit C1 of data symbol $D_1$ is "1", the margin bit combination 10 is inhibited ($M_{inh}$=10).

The foregoing 3 conditions are not mutually exclusive; and from FIG. 28 it is seen that conditions may exist which preclude the margin bit combinations 01 and 10 (both margin bit conditions are precluded if the most significant bit C1 of data symbol $D_2$ is "1" or if the least significant bit C14 of data symbol $D_1$ is "1"). The number of inhibit margin bit combinations is represented as NI. If NI=0, all three margin bit combinations may be used. If NI=1, one of the three margin bit patterns is precluded and the other two may be used. If NI=2, two of the margin bit patterns are precluded but the third is permitted. It will be appreciated that NI never is three.

Figure 25:
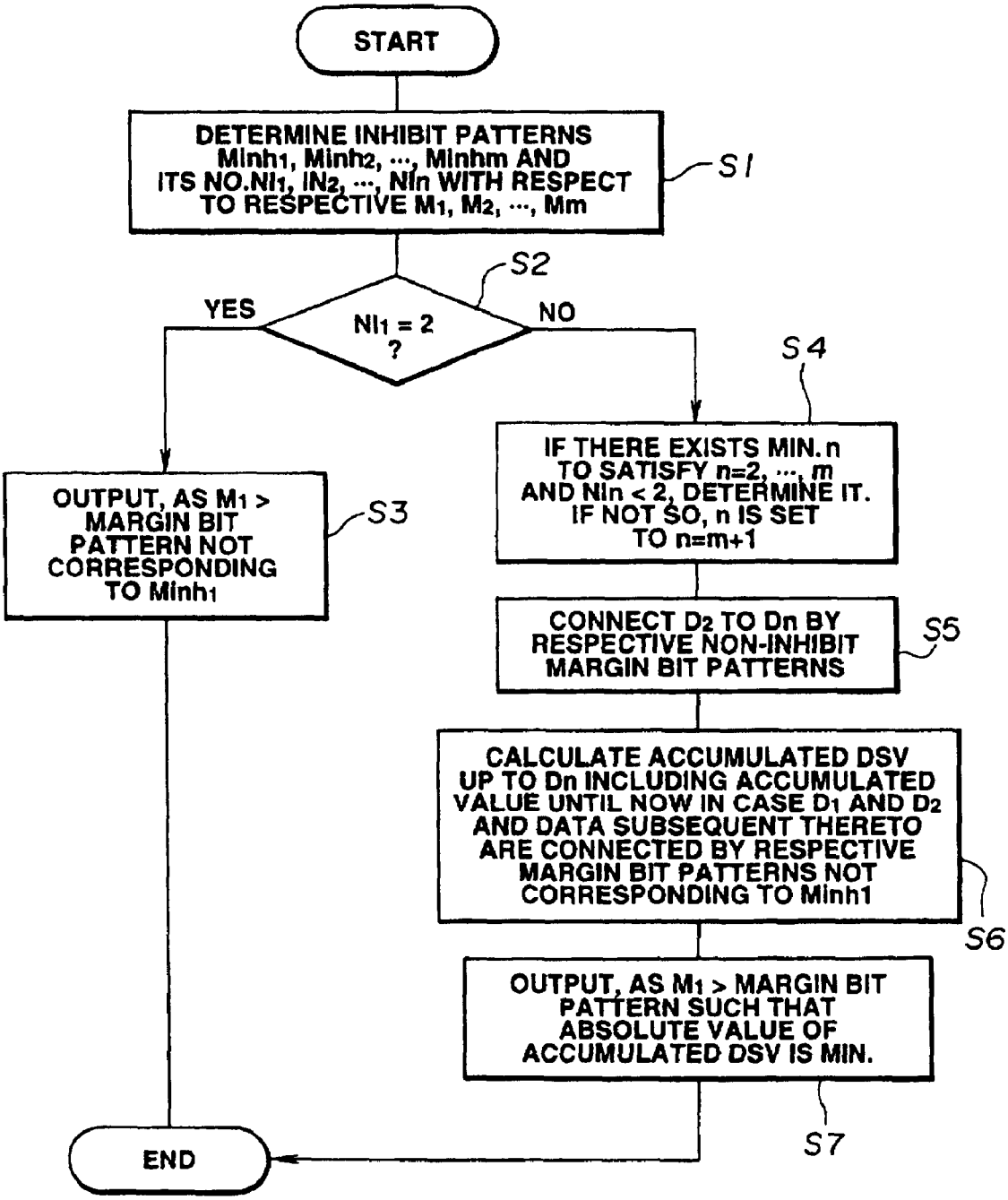
FIG. 25 is a flowchart explaining how margin bits are selected in the EFM modulated data shown in FIG. 24.

Turning now to FIG. 25, there is illustrated a flow chart which represents the manner in which a margin bit combination is selected for insertion by a margin bit generator between two data symbols. At step S1, the inhibited margin bit combinations are determined for each set of margin bits $M_1$, $M_2$ . . . $M_m$ and the number of inhibited margin bit combinations $NI_1$, $NI_2$, . . . $NI_m$ likewise is determined. It will be appreciated that $M_{inh}$ and NI for each set of margin bits to be inserted between data symbols may be determined from the conditions depicted in FIG. 28.

The flow chart then advances to inquiry S2 which determines if the number of inhibited combinations for the margin bit pattern $M_1$ is equal to 2. If so, the flow chart advances to step S3 and only a single margin bit combination can be selected. For example, if the most significant bit of data symbol $D_2$ is "1", $NI_1$=2 and $M_{inh}$=01, 10. Step S3 thus permits only margin bit combinations 00 to be selected as the margin bit pattern $M_1$.

However, if inquiry S2 is answered in the negative, then two or three different margin bit combinations can be selected. The flow chart advances to step S4 where the inhibited margin bit combination Minh for the n-th margin bit pattern (n72) is determined. But, if the number of inhibited combinations for the second margin bit pattern is 2, that is, if $NI_2$=2, then the n-th margin bit pattern is construed as the (m+1)th margin bit pattern. That is, if $NI_2$=2, only one margin bit combination can be selected for the remaining margin bit patterns $M_n$. The flow chart then advances to step S5 wherein data symbol $D_2$ is linked to data symbol $D_3$ which is linked to data symbol $D_4$. . . to data symbol $D_n$ by the respective margin bit combinations which are not inhibited.

Thereafter, in step S6, since the margin bit patterns up to $M_n$ have been selected, and since the data symbols up to $D_n$ are known, the accumulated DSV up to $D_n$ is calculated. The DSV determined for this data symbol simply is added to the DSV which has been accumulated from previous data symbols. Then, in step S7, the margin bit pattern $M_1$ is selected as the particular margin bit combination which minimizes the DSV that is projected to be accumulated up to data symbol $D_n$.

Figure 29:
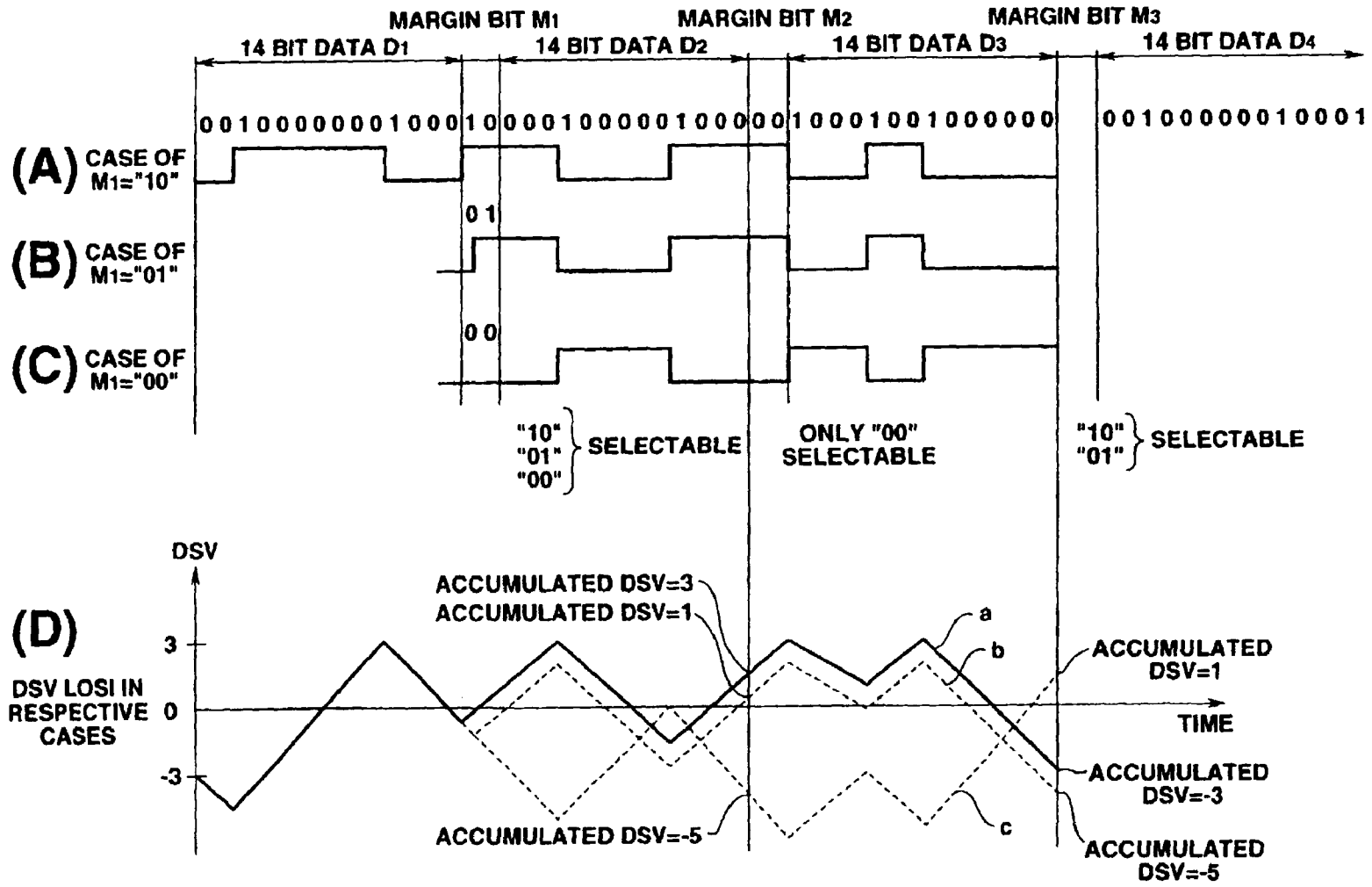
FIGS. 29A–29D are explanatory waveforms which are useful in understanding how margin bits are selected.

It will be appreciated that steps S4–S7 rely upon a projected DSV; and although the margin bit pattern under consideration is margin pattern $M_1$, the technique for selecting the appropriate margin bit combination for pattern $M_1$ as based upon look ahead data symbols $D_2$, $D_3$, . . . $D_n$. FIG. 29 is a graphical representation of the manner in which the projected DSV is accumulated based upon "look ahead" data symbols. For simplification, it is assumed that m=3, that data symbols $D_1$, $D_2$ and $D_3$ are known, that the accumulated DSV up to data symbol $D_1$ is known and that margin bit pattern $M_1$ is to be selected. FIG. 29A represents the 14-bit data symbol, wherein a "1" is represented by a transition and a "0" is represented by no transition in the digital signal. The data symbols shown in FIG. 29A are the same data signals used in FIGS. 29B and 29C. FIG. 29A represents the margin bit pattern $M_1$ as the combination 10; FIG. 29B represents the margin bit pattern $M_1$ as the combination 01 and FIG. 29C represents the margin bit pattern $M_1$ as the combination 00. It is assumed that $NI_1$=0, meaning that there are no inhibited margin bit combinations for margin bit pattern M. It is further assumed that the least significant bit of a data symbol is represented as "CWLL" and CWLL=0 in each of data symbols $D_1$, $D_2$ and $D_3$. Furthermore, based upon the most significant bit of data symbol $D_3$, margin bit combinations 01 and 10 are inhibited (see FIG. 28) and $NI_2$=2. Finally, based upon the bit stream of the trailing end of data symbol $D_3$ and the bit stream at the leading end of data symbol $D_4$, margin bit combination 00 is inhibited for $M_3$ (see FIG. 28) and $NI_3$=1.

FIG. 29D illustrates the accumulated DSV that is obtained up to the end of data symbol $D_3$ if $M_1$=0, if $M_1$=01 and if $M_1$=00. In particular, curve a of FIG. 29D illustrates the accumulated DSV when $M_1$=10; curve b represents the accumulated DSV when $M_1$=01; and curve c represents the accumulated DSV when $M_1$=00. It is seen that at the end of data symbol $D_2$, DSV=3 if $M_1$=10; DSV=1 if $M_1$=01; and DSV=−5 if $M_1$=00. Thus, to minimize the accumulated DSV, the margin bit combination 01 should be selected for margin bit pattern $M_1$. But, if the margin bit combination 01 is selected, the accumulated DSV at the end of data symbol $D_3$ is seen to be DSV=−5. On the other hand, if the margin bit combination 00 had been selected for the margin bit pattern $M_1$, the accumulated DSV at the end of data symbol $D_3$ is DSV=1. It is appreciated then, that if the projected DSV is examined, the particular margin bit combination that is selected for margin bit pattern $M_1$ differs from the margin bit combination that would be selected if the projected DSV is not examined.

Figure 26:
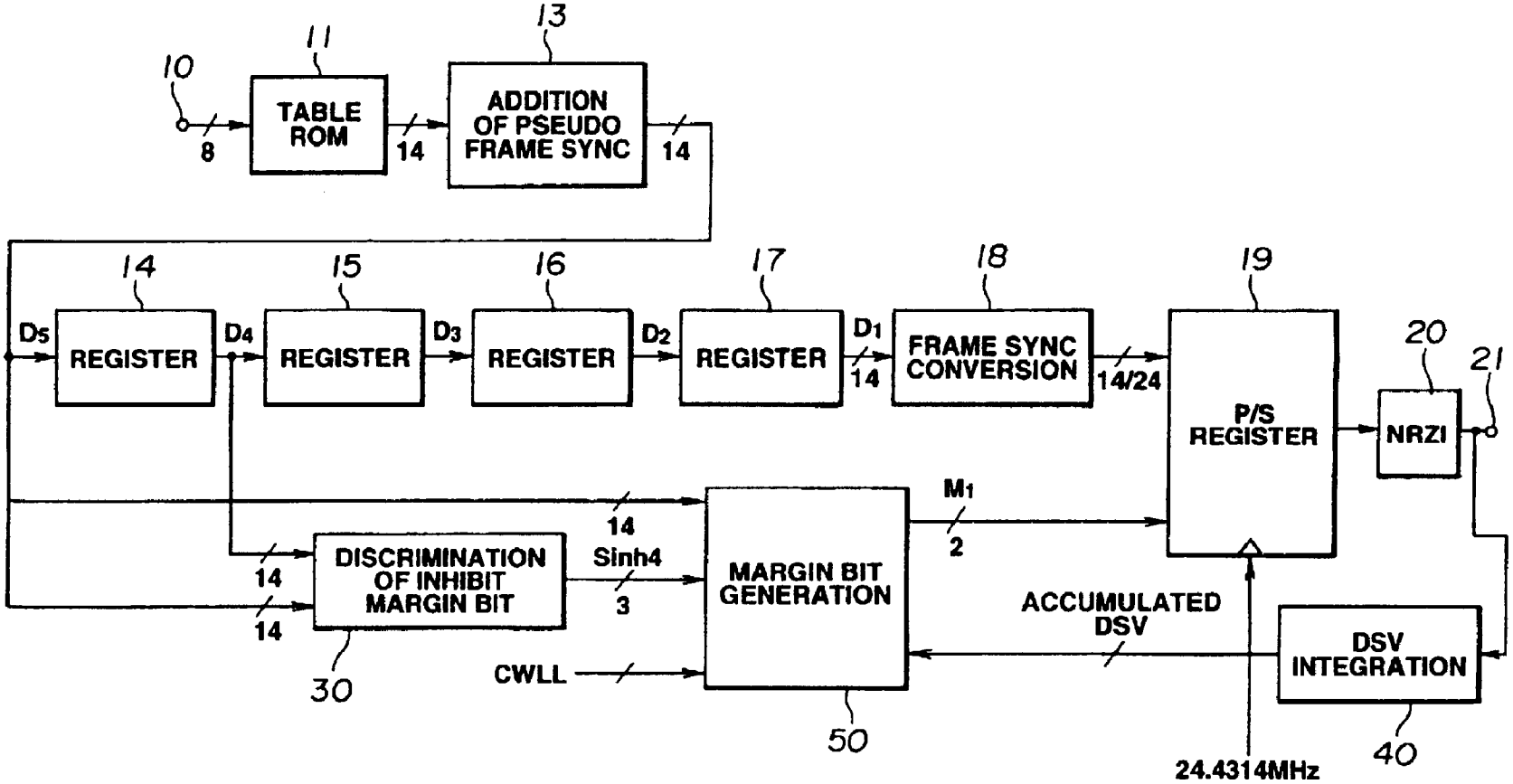
FIG. 26 is a block diagram of an EFM modulator that can be used to produce the data string shown in FIG. 24.

FIG. 26 is a block diagram of margin bit selection apparatus in which the margin bit combination for margin bit pattern $M_1$ is determined by looking ahead by up to m data symbols, where m=4. Thus, the accumulated DSV up to the end of data symbol $D_5$ is calculated. Input terminal 10 in FIG. 26 is supplied with 32 successive bytes that have been ECC encoded, and these bytes are used to read out 14-bit symbols from a conversion table 11 stored as a ROM. Successive 14-bit symbols are coupled to an adder 13 which adds a pseudo frame sync signal to the successive data symbols, the pseudo frame sync signal $S^1_f$ ("1XXXXXXXXXXX10") being added to the leading portion of each sync frame. The pseudo frame sync signal serves to "reserve" a location in which the actual frame sync pattern is inserted, as will be described.

Successive data symbols are coupled to registers 14–17 wherein each data symbol is stored. Thus, register 17 stores data symbol $D_1$, register 16 stores data symbol $D_2$, register 15 stores data symbol $D_3$, register 14 stores data symbol $D_4$ and adder 13 now supplies data symbol $D_5$ to the input of register 14. Data symbols $D_4$ and $D_5$ are coupled to discriminator 30 which examines these data symbols to determine if any of the bit patterns therein correspond to those shown in FIG. 28. Depending upon the sensed bit patterns, discriminator 30 generates the inhibit margin bit signal $M_{inh}$ which precludes certain margin bit combinations from margin bit pattern $M_4$. The inhibit margin bit signal produced by the discriminator is comprised of 3 bits and is identified as the margin bit inhibit signal $S_{inh4}$. A "1" in the first bit position of $S_{inh4}$ inhibits the margin bit combination 10, a "1" in the second bit position of $S_{inh4}$ inhibits the margin bit combination 01 and a "1" in the third bit position of $S_{inh4}$ inhibits the margin bit combination 00. As an example, if only the margin bit combination 00 is a permitted margin bit pattern, margin bit inhibit signal $S_{inh4}$ is represented as "110".

The output of register 17 is coupled to a frame sync converter 18 which converts the 14-bit pseudo frame sync signal $S^1_f$ to a 24-bit frame sync signal Sf. This 24-bit frame sync signal Sf is coupled to parallel-to-serial register 19. Those data symbols $D_1$, $D_2$, . . . which are supplied successively to frame sync converter 18 are not modified thereby and are supplied as is, that is, in their 14-bit configuration, to the parallel-to-serial register. Register 19 converts those bits which are supplied thereto in parallel to serial output form. In addition, after a 14-bit data symbol is serially read out of the register, a 2-bit margin pattern produced by a margin bit generator 50 is serially read out of the register. Parallel-to-serial register 19 is clocked with a channel bit clock having a frequency of 24.4314 MHz such that the serial bit output rate of register 19 is 24.4314 Mbps. These serial bits are modulated by an NRZI modulator 20 and coupled to an output 21 for recording.

The modulated NRZI serial bits also are fed back to a DSV integrator 40 which integrates the DC component of such serial bits. The DSV integrator thus accumulates the DSV of the data symbols and margin bit patterns.

Margin bit generator 50 functions in accordance with the flow chart shown in FIG. 25 to effect the operation illustrated by the waveforms of FIGS. 29A–29D. It is appreciated, then, that the margin bit generator 50 may be a digital signal processor, an arithmetic logic unit or a microprocessor programmed in accordance with the flow chart of FIG. 25. Thus, the appropriate margin bit combination is selected in order to minimize the accumulated DSV will obtain as a result of m subsequent data symbols.

Figure 30:
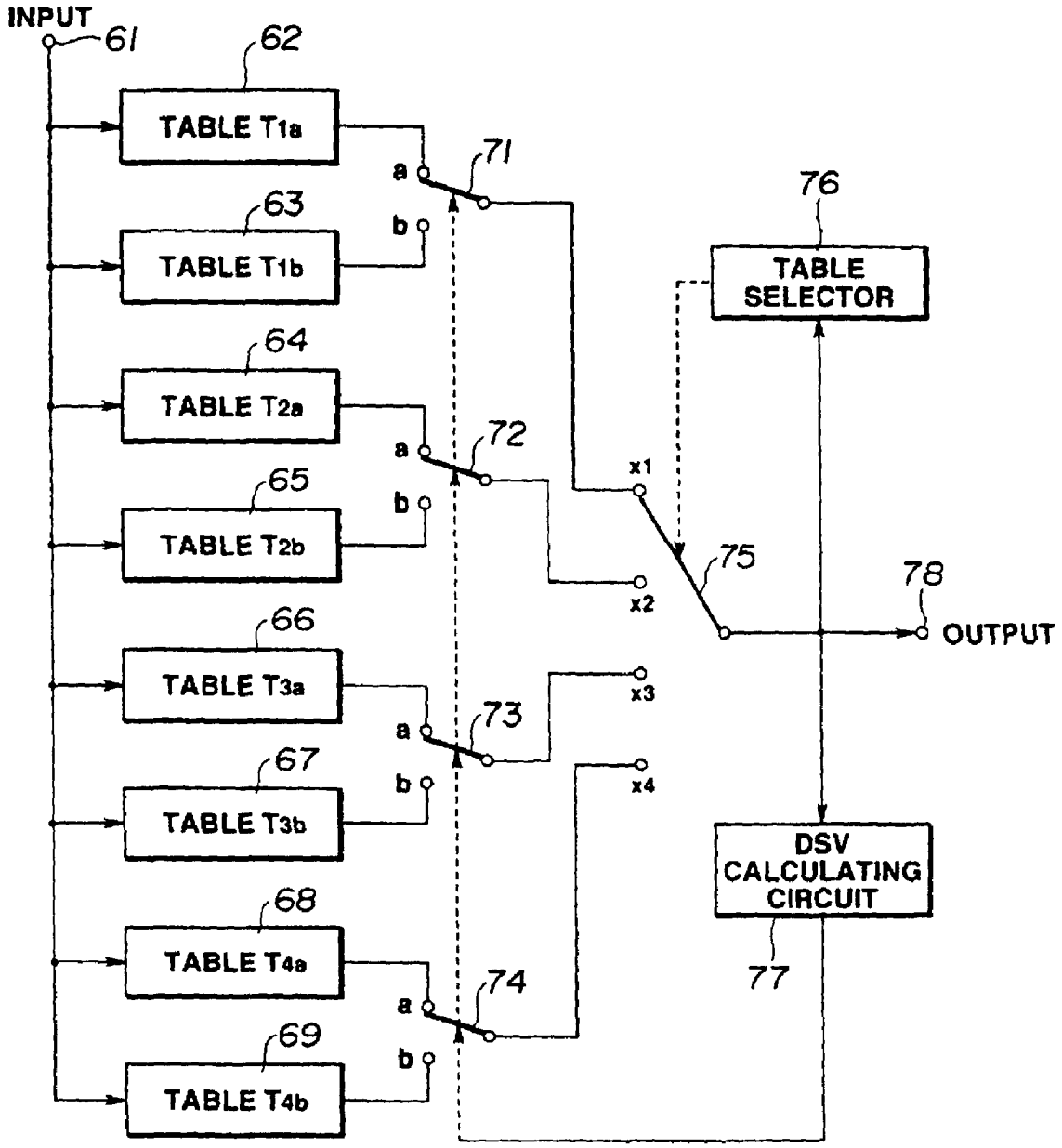
FIG. 30 is a block diagram of a modulator that may be used with the present invention.

The foregoing has described an EFM technique in which a margin bit pattern is inserted between successive 14-bit data symbols. As a result, each 8-bit byte is converted into a 14-bit data symbol plus a 2-bit margin pattern. A preferred embodiment of an 8-to-16 modulator which eliminates the generation of margin bit patterns, which minimizes the accumulated DSV and which is constrained to run length limited (2, 10) code now will be described. Referring to FIG. 30, a plurality of "fundamental conversion tables are provided, for example, four conversion tables $T_1$, $T_2$, $T_3$ and $T_4$. Each fundamental table is comprised of two separate tables, identified by the subscripts a and b, one of which converts an 8-bit byte into a 16-bit symbol having positive DSV and the other converting the same 8-bit byte into a 16-bit symbol having negative DSV.

The tables are categorized as follows: if the last bit of the immediately preceding 16-bit symbol ends as a "1" or if the last two bits of that 16-bit symbol end as "10", the next 16-bit symbol is selected from table $T_{1a}$ or table $T_{1b}$, depending upon whether it is desirable that this next selected 16-bit symbol exhibit a positive DSV (thus calling for table $T_{1a}$) or a negative DSV (thus calling for table $T_{1b}$).

If the immediately preceding 16-bit symbol ends with two, three or four successive 0s, the next-following 16-bit symbol is selected from either table $T_2$ (that is, from either table $T_{2a}$ or table $T_{2b}$) or from table $T_3$ (that is, from table $T_{3a}$ or table $T_{3b}$).

If the immediately preceding 16-bit symbol ends with six, seven or eight successive 0s, the next-following 16-bit symbol is selected from table $T_4$.

The first 16-bit symbol that is generated immediately following a frame sync pattern is selected from table $T_1$.

The 16-bit symbols produced from tables $T_2$ and $T_3$ differ from each other in the following important respects: all 16-bit symbols read from table $T_2$ include a "0" as the first bit and a "0" as the thirteenth bit.

All 16-bit symbols read from table $T_3$ include a "1" as the first or thirteenth bit or a "1" as both the first and thirteenth bit.

In the 8-to-16 conversion scheme used with the present invention, it is possible that the very same 16-bit symbol may be generated in response to two different 8-bit bytes. However, when the 16-bit symbol representative of one of these bytes is produced, the next-following 16-bit symbol is produced from table $T_2$; whereas when the 16-bit symbol representative of the other byte is produced. the next-following 16-bit symbol is produced from table $T_3$. It is appreciated that, by recognizing the table from which the next-following 16-bit symbol is produced, discrimination between the two bytes which, nevertheless, are converted into the same 16-bit symbol may be readily achieved.

For example, let it be assumed that an 8-bit byte having the value 10 and an 8-bit byte having the value 20 both are converted to the same 16-bit symbol 0010000100100100 from table $T_2$. But, when this 16-bit symbol represents the byte having the value 10, the next-following 16-bit symbol is produced from table $T_2$, whereas when the aforenoted 16-bit symbol represents the byte having the value 20, the next-following 16-bit symbol is produced from table $T_3$. When the symbol 0010000100100100 is demodulated, it cannot be determined immediately if this symbol represents the byte having the value 10 or the byte having the value 20. But, when the next-following 16-bit symbol is examined, it is concluded that the preceding symbol 0010000100100100 represents the byte 10 if the next-following symbol is from table $T_2$, and represents the byte having the value 20 if the next-following symbol is from table $T_3$. To determine whether the next-following 16-bit symbol is from table $T_2$ or table $T_3$, the demodulator merely needs to examine the first and thirteenth bits of the next-following symbol, as discussed above.

Table $T_a$ (for example, table $T_{1a}$) includes 16-bit symbols having a DSV which increases in the positive direction. Conversely, the 16-bit symbols which are stored in table $T_b$ have a DSV which increases in the negative direction. As an example, if the value of an 8-bit byte is less than 64, this byte is converted into a 16-bit symbol having a relatively large DSV. Conversely, if the value of the 8-bit byte is 64 or more, this byte is converted into a 16-bit symbol having a small DSV. Those 16-bit symbols which are stored in table $T_a$ have positive DSV and those 16-bit symbols which are stored in table $T_b$ have negative DSV. Thus, an input byte is converted into a 16-bit symbol having positive or negative DSV, depending upon which table is selected for conversion, and the value of the DSV is large or small,small, depending upon the value of the input byte that is converted.

The tables $T_{1a}$, $T_{1b}$, . . . $T_{4a}$, $T_{4b}$ in FIG. 30 may be constructed as ROMs 62–69. An input to be converted is supplied from an input terminal 61 in common to each of these ROMs. The pair of tables $T_a$, $T_b$ of a fundamental table are coupled to a selector switch which selects one or the other table to have read out therefrom the 16-bit symbol which corresponds to the input byte read out therefrom. As shown, selector switch 71 selectively couples the output from table $T_{1a}$ or table $T_{1b}$ to an input x1 of an output switch 75. Similarly, switch 72 selectively couples table $T_{2a}$ or table $T_{2b}$ to an input x2 of switch 75. Switch 73 selectively couples table $T_{3a}$ or table $T_{3b}$ to input x3 of switch 75. Switch 74 selectively couples table $T_{4a}$ or table $T_{4b}$ to input x4 of switch 75. Output switch 75 selectively couples one of its inputs x1–x4 to an output terminal 78 under the control of a table selector 76. Selector switches 71–74 select either table $T_a$ or table $T_b$ under the control of a DSV calculator 77. The 16-bit symbol which ultimately is supplied to output 78 also is coupled to the table selector and to the DSV calculator, as illustrated.

Table selector 76 senses the ending bits of the 16-bit symbol supplied from switch 75 to output terminal 78 to determine whether fundamental table $T_1$, $T_2$, $T_3$ or $T_4$ should be selected, in accordance with the table selecting conditions discussed above. It is appreciated that the table selector thus controls switch 75 to select the 16-bit symbol read from the proper fundamental table. For example, if it is assumed that the 16-bit symbol supplied to output terminal 78 ends with six, seven or eight successive 0s, switch 75 is controlled by the table selector to couple its input x4 to the output terminal such that the next-following 16-bit symbol is read from fundamental table $T_4$. DSV calculator 77 calculates the accumulated DSV, which is updated in response to each 16-bit symbol supplied to output terminal 78. If the DSV increases in the positive direction, DSV calculator 77 controls selector switches 71–74 to couple the outputs from their respective tables $T_b$. Conversely, if the accumulated DSV is calculated to increase in the negative direction, selector switches 71–74 are controlled by the DSV calculator to couple the outputs from their respectively tables $T_a$. It is expected, therefore, that if the preceding 16-bit symbol exhibits a larger negative DSV, switches 71–74 are controlled to select the next 16-bit symbol having a positive DSV; and the particular table from which this next 16-bit symbol is read is determined by table selector 76. Thus, the accumulated DSV is seen to approach and oscillate about 0.

Figure 31:
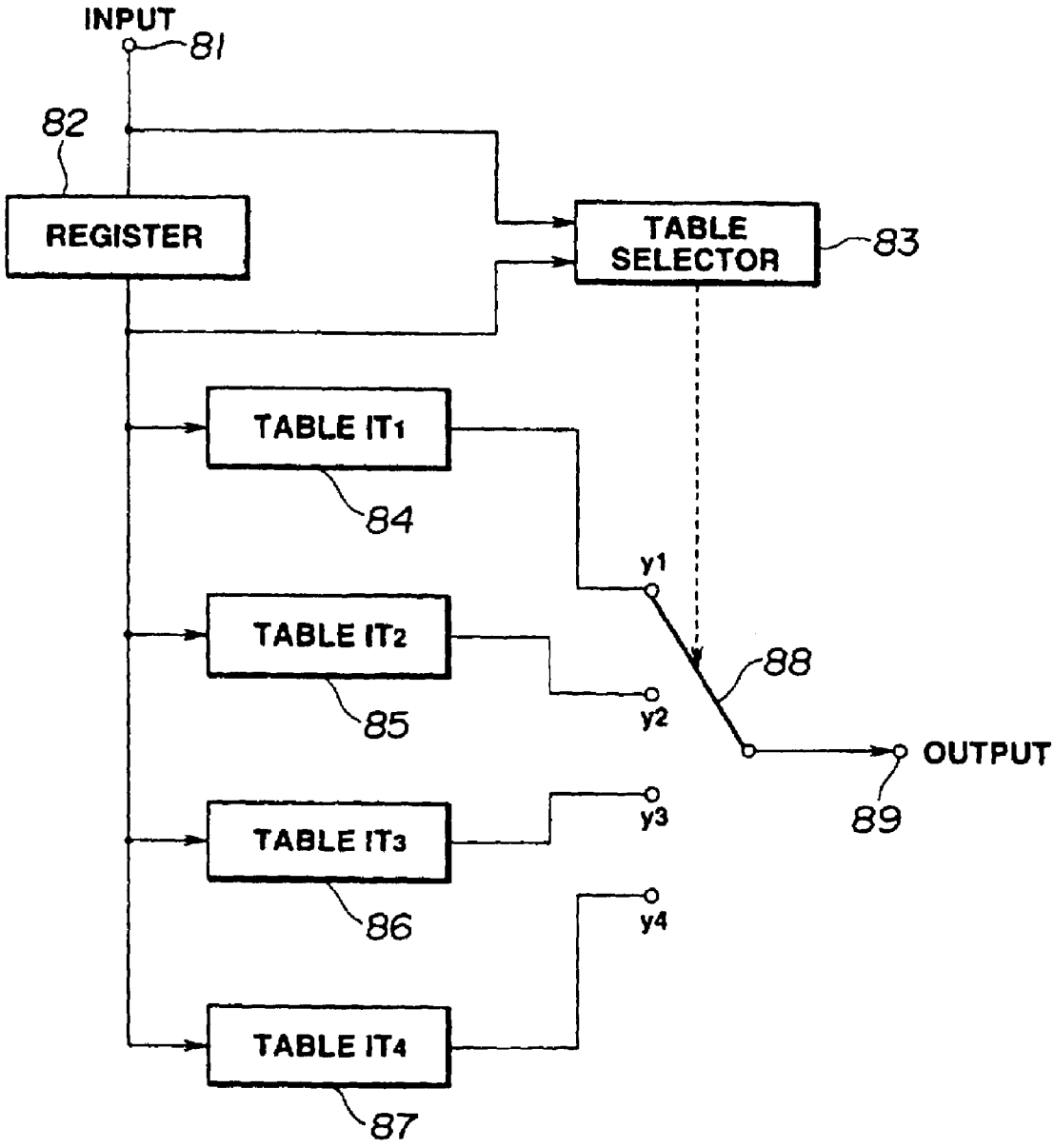
FIG. 31 is a block diagram of a demodulator that may be used with the present invention.

An example of a 16-to-8 bit converter, that is, a demodulator compatible with the 8-to-16 bit modulator of FIG. 30, is illustrated in FIG. 31. Here, tables are used to carry out an inverse conversion from 16-bit symbols to 8-bit bytes and such tables are identified as tables $IT_1$, $IT_2$, $IT_3$ and $IT_4$. These tables may be stored in ROMs 84, 85, 86 and 87. It is expected that each 8-bit byte read from a table corresponds to two 16-bit symbols, one having positive DSV and the other exhibiting negative DSV. Alternatively, if the 16-bit symbol is used as a read address, each 8-bit byte stored in a table may have two read addresses. Stated otherwise, each 8-bit byte may be stored in two separate read address locations.

An input terminal 81 is supplied with a 16-bit symbol, and this symbol is stored temporarily in a register 82 and then coupled in common to inverse conversion tables $IT_1$–$IT_4$. In addition, a table selector 83 is coupled to input terminal 81 and to the output of register 82 so that it is supplied concurrently with the presently received 16-bit symbol and the immediately preceding 16-bit symbol. Alternatively, table selector 83 may be thought of as being supplied with the presently received 16-bit symbol (from the output of register 82) and the next-following 16-bit symbol. The table selector is coupled to an output selector switch 88 which couples to output terminal 89 either conversion table $IT_1$ or conversion table $IT_2$ or conversion table $IT_3$ or conversion table $IT_4$.

The manner in which table selector 83 operates now will be described. As mentioned above, the first symbol that is produced immediately following the frame sync pattern is read from conversion table $T_1$ in FIG. 30. Table selector 83 thus operates to detect the frame sync pattern so as to control output switch 88 to couple table $IT_1$ to output terminal 89.

If, as mentioned above, a 16-bit symbol may represent one or the other of two different 8-bit bytes, table selector 83 senses whether the next-following 16-bit symbol, as supplied thereto from input terminal 81, is from conversion table $T_2$ or conversion table $T_3$. This determination is made by examining the first and thirteenth bits of such next-following 16-bit symbol. If the table selector senses that the next-following 16-bit symbol is from table $T_2$, output switch 88 is suitably controlled to select the inverse conversion table which converts the 16-bit symbol presently provided at the output of register 82 to its proper 8-bit byte. A similar operation is carried out when table selector 83 senses that the next-following 16-bit symbol had been read from conversion table $T_3$ in FIG. 30.

The present invention converts an 8-bit byte into a 16-bit symbol, whereas the prior art converts an 8-bit byte into a 14-bit symbol and inserts three margin bits between successive symbols. Consequently, since the present invention uses only 16 bits in its bit stream as compared to the prior art use of 17 bits, the modulation technique of the present invention results in an effective reduction in data of 16/17, or about 6%.

While the present invention is particularly applicable to a CD-ROM on which computer data, video data, a combination of video and audio data or computer files may be recorded, this invention is particularly useful in recording and reproducing digital video discs (DVD) on which video data and its associated audio data are recorded. Such data is compressed in accordance with the MPEG standard; and when compressed video data is recorded on the disc, the subcode information included in each sector header (FIG. 10) includes a subcode address having the value 3 or the value 4 with the resultant subcode field appearing as shown in FIGS. 11D or 11E. If the subcode address value is 3, the user data recorded in the sector conforms to the standard ISO 11172-2 (MPEG 1) or ISO 13818-2 (MPEG 2). Data that is recorded in the subcode field, as shown in FIG. 11D, represents the difference between the address of the sector which contains this subcode and the lead sector in which the previous I picture or next-following I picture is recorded. It is expected that an I picture (that is, an intraframe encoded picture, as mentioned previously) is recorded in two or more sectors. Of course, each sector includes a header. However, the distance data which is recorded in the subcode field shown in FIG. 11D represents the distance to the lead, or first sector in which the previous I picture or next-following I picture is recorded. If an I picture is recorded partially in one sector and partially in another, the sector header of the "other" sector includes 0 data to represent the previous I distance and the next I distance in FIG. 11D. That is, the previous I distance and the next I distance are 0.

If the subcode address value is 4, the subcode field appears as shown in FIG. 11E and, as mentioned above, the picture type data indicates whether the video data that is recorded in compressed form in this sector is I, P or B picture data and the temporal reference data indicates the location in the sequence of pictures in which this particular video picture is disposed. The sector in which an I, P or B picture first is recorded is referred to as an I, P or B sector, respectively, even if such I, P or B picture data is recorded in a trailing portion of that sector, while other picture data is recorded in a leading portion thereof.

Figure 32:
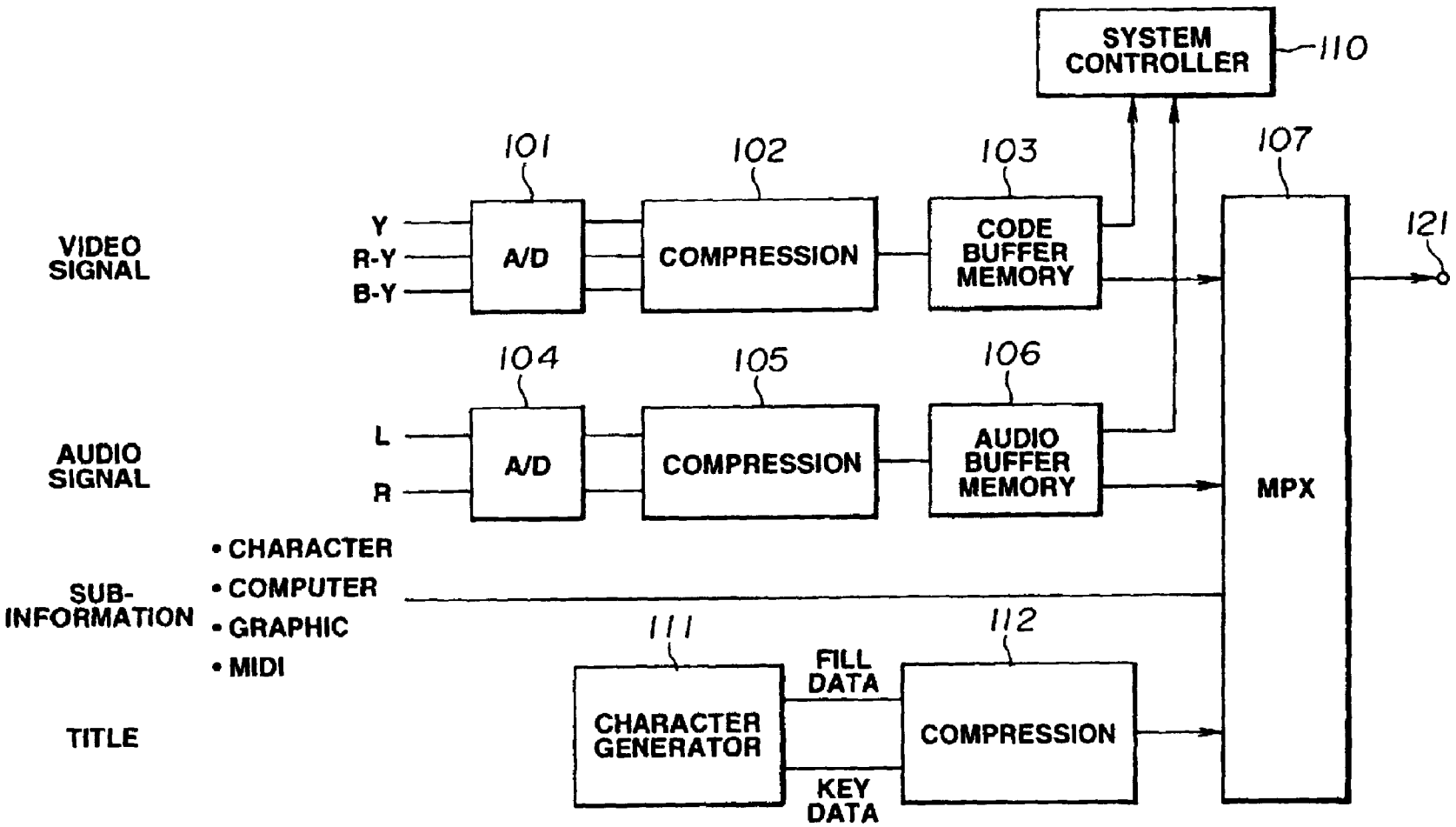
FIG. 32 is a block diagram of apparatus which may be used to supply data for the recording technique shown in FIG. 1.

FIG. 32 is a block diagram of compression apparatus which is used to supply to input terminal 121 of FIG. 1 MPEG compressed video data. Video information, supplied as, for example, analog luminance (Y) and color difference (R-Y and B-Y) signals are digitized by an analog-to-digital converter 101 and compressed in accordance with the MPEG compression system by video compression circuitry 102. The compression system may be consistent with the MPEG-1 standard (ISO 11172-2) or the MPEG-2 standard (ISO 13818-2). The compressed video data is stored in a buffer memory 103 from which it is supplied to a multiplexor 107 for multiplexing with other data (soon to be described) which then is input to input terminal 121 (FIG. 1). Information related to the compressed video data stored in buffer memory 103 is supplied to system controller 110, this information being indicative of, for example, whether the compressed video data corresponds to an I, P or B picture, the temporal sequence of display pictures in which this compressed video picture is located, time code representing the time of receipt or time of recording of the video data, etc. The information derived from the stored, compressed video data and supplied to the system controller is used to generate subcode information that is recorded in the sector header. It is recalled from FIG. 1 that this information is supplied from system controller 110 to sector header encoder 129 for insertion into the sector header of the user data.

Audio signals, such as analog left-channel and right-channel signals L and R are digitized by an analog-to-digital converter 104 and compressed in an analog data compression circuit 105. This compression circuit may operate in accordance with the Adaptive Transform Acoustic Coding technique (known as ATRAC) consistent with MPEG-1 audio compression or MPEG-2 audio compression standards. It is appreciated that this ATRAC technique presently is used to compress audio information in recording the medium known as the "Mini Disc" developed by Sony Corporation. The compressed audio data is supplied from compression circuit 105 to an audio buffer memory 106 from which it subsequently is coupled to a multiplexor 107 for multiplexing with the compressed video data. Alternatively, compression circuit 105 can be omitted and the digitized audio data can be supplied directly to a buffer memory 106 as, for example, a 16-bit PCM encoded signal. Selective information stored in the audio buffer memory is coupled to the system controller for use in generating the subcode information that is recorded in the sector header.

Additional information, identified in FIG. 32 as sub-information, including character, computer, graphic and musical instrument for digital interface data (MIDI) also is coupled to multiplexor 107.

Title data is generated by a character generator 111 which, for example, may be of conventional construction. The title data is identified as fill data and key data and is compressed by a compression circuit 112 which encodes the title data in variable run length coding. The compressed title data is coupled multiplexor 107 for subsequent application to the input terminal 121 shown in FIG. 1.

Preferably, multiplexor 107 multiplexes the compressed video, audio and title data, together with the sub-information, in accordance with the MPEG-1 or MPEG-2 standard, as may be desired. The output of the multiplexor is coupled to input terminal 121 of FIG. 1 whereat the multiplexed data is ECC encoded, modulated and recorded on disc 100.

Figure 33:
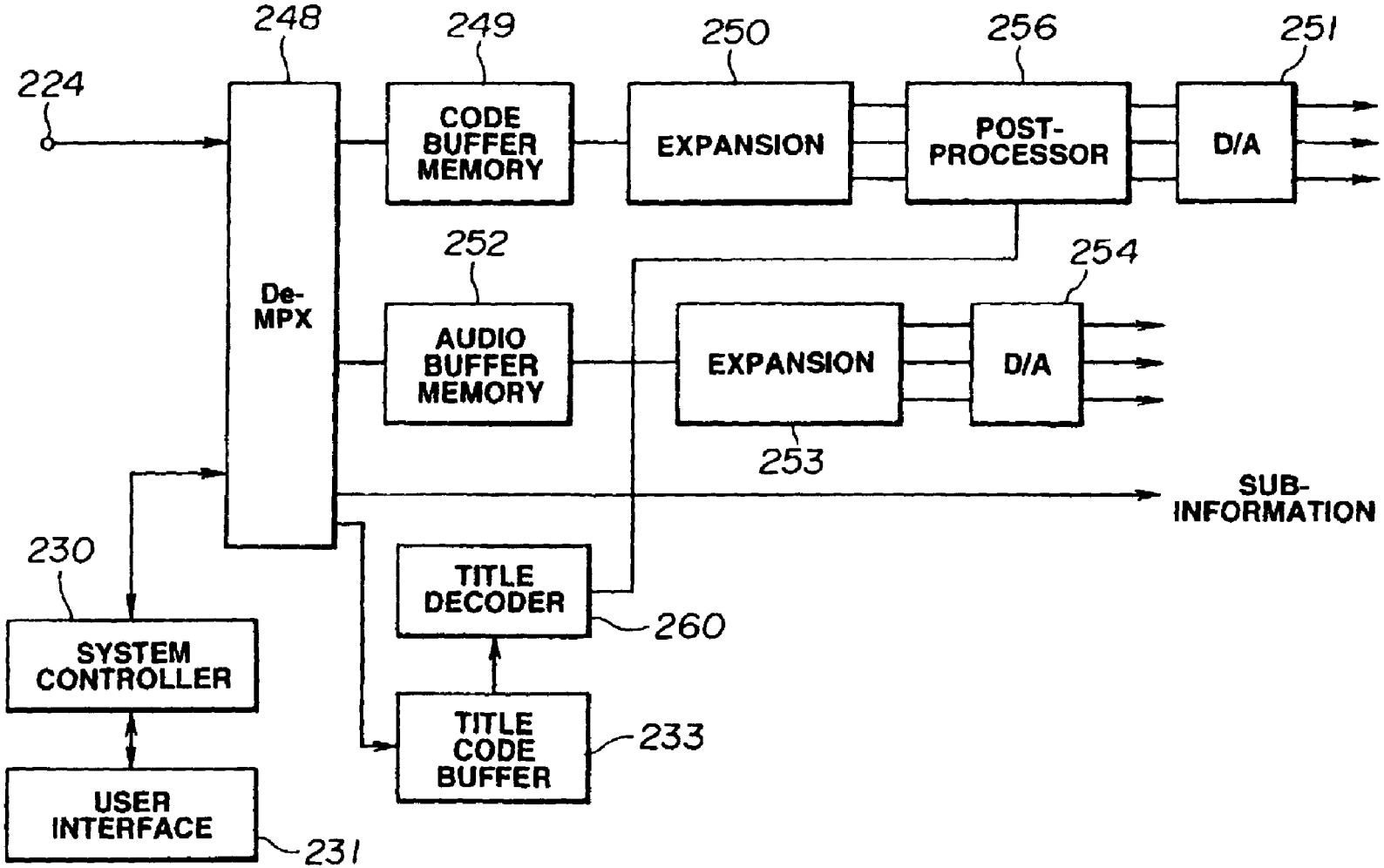
FIG. 33 is a block diagram of data recovery apparatus that may be used with the playback apparatus shown in FIG. 2.

FIG. 33 is a block diagram of circuitry for recovering the video, audio, title and sub-information data that had been recorded on disc 100 and that had been reproduced from the disc by the playback apparatus shown in FIG. 2. The input to the data recovery circuit shown In FIG. 33 is output terminal 224 of FIG. 2. This terminal is coupled to a demultlplexor 248 which demultiplexes the aforedescribed multiplexed video, audio and title data as well as the sub-information. The demultiplexor operates in accordance with the MPEG-1 or MPEG-2 standard, as may be desired, to separate the compressed video data, the compressed audio data, the compressed tine data and the sub-information. The compressed video data is stored in a buffer memory 249 from which it is expanded in expansion circuit 250, processed in a post processor 256, for example, as may be needed to conceal errors, and reconverted back to analog form by digital-to-analog converter 251. Expansion circuit 250 operates in accordance with the MPEG-1 or MPEG-2 standard such that the original video information is recovered.

Post processor 256 also is adapted to superimpose graphical title information on the recovered video data, as will be described below, such that the recovered title data may be suitably displayed, as by superposition on a video picture.

The separated audio data is supplied from demultiplexor 248 to an audio buffer memory 252 from which it is expanded in an expansion circuit 253 and reconverted to analog form by digital-to-analog convertor 254. Expansion circuit 253 operates in accordance with the MPEG-1 or MPEG-2 or mini disc standard, as may be desired. If the audio data that is recorded on disc 100 has not been compressed. expansion circuit 253 may be omitted or bypassed.

As depicted in FIG. 33, the sub-information separated by demultiplexor 248 is supplied as a direct output signal, consistent with the representation shown in FIG. 32 wherein such subinformation is not processed prior to being supplied to multiplexor 107 and no processing subsequent to demultiplexor 248 is illustrated.

The separated title data is applied to title buffer memory 233 from demultiplexor 248 from which the title data is decoded by a title decoder 260 that operates in a manner inverse to the operation of compression circuit 112 (FIG. 32). That is. decoder 260 may carry out an inverse variable length decoding operation. The decoded title data is supplied to post processor 256 for superposition onto the video information that has been played back from the optical disc.

Demultiplexor 248 monitors the remaining capacities of buffer memories 249, 252 and 233 to sense when these memories are relatively empty or filled. The purpose of monitoring the remaining capacities of the buffer memories is to assure that data overflow therein does not occur.

System controller 230 and user interface 231 of FIG. 33 are the same as system controller 230 and user interface 231 in FIG. 2.

While the present invention has been particularly shown and described with reference to preferred embodiments, it will be readily apparent to those of ordinary skill in the art that various changes and variations may be made without departing from the spirit and scope of the invention. To the extent that such variations and changes have been mentioned herein, the appended claims are to be interpreted as including such variations and changes as well as all equivalents to those features which have been particularly disclosed.

What is claimed is:

1. A method of recording data on an optical disk having a diameter less than 140 mm, a thickness of 1.2 mm±0.1 mm and a recording area divided into a lead-in area, a program area and a lead-out area, said method comprising the steps of: providing user information for recording in a plurality of sectors in user tracks; providing table of contents (TOC) information for recording in a plurality of sectors in at least one TOC track, said TOC information including addresses of respective start sectors, each identifying a start sector of a respective user track; encoding both said user information and said TOC information in a long distance error correction code having at least eight parity symbols; modulating the encoded user and TOC information; recording the modulated, encoded TOC information as embossed pits in said at least one TOC track in said lead-in area; and recording the modulated, encoded user information as embossed pits in said user tracks in said program area with a track pitch in the range between 0.646 μm and 1.05 μm.

2. The method of claim 1 wherein each of said steps of recording is operative to record said embossed pits with a linear density in the range between 0.237 μm per bit and 0.378 μm per bit.

3. The method of claim 1 wherein the step of recording embossed pits in said program area is operative to record said program area in a portion of the disk having a radius of from 20 mm to 65 mm.

4. The method of claim 1 wherein said step of recording the modulated encoded TOC information includes the step of recording is said program area modulated, encoded TOC information substantially identical to the TOC information recorded in said lead-in area.

5. The method of claim 1 wherein said step of recording said TOC information includes the steps of recording TOC identification data for identifying a location of said at least one TOC track, recording a data configuration of said at least one TOC track, and recording a sector configuration of each of said plurality of sectors.

6. The method of claim 1 wherein said TOC information includes data representative of disk size.

7. The method of claim 1 wherein said TOC information includes data representative of a time code associated with said user information.

8. The method of claim 1 wherein said user information is reproducible at a selected one of plural playback speeds; and said step of recording said TOC information includes the step of recording data representative of said selected playback speed.

9. The method of claim 1 wherein the step of encoding comprises encoding said user and TOC information in a convolution code.

10. The method of claim 1 wherein said TOC information is representative of record/playback characteristics, diameter, recording capacity and number of record tracks of said optical disk.

11. The method of claim 10 wherein said record/playback characteristics of said optical disk represent a read only disk, a write once disk or an erasable disk.

12. The method of claim 1 wherein said step of modulating comprises run length limited (RLL) modulating said encoded user and TOC information.

13. The method of claim 12 wherein said RLL modulating is (2,10) modulation, such that successive transitions are separated by no less than 2 data bit cells and by no more than 10 data bit cells.

14. The method of claim 13 wherein said step of modulating further comprises converting n-bit data words representing said user and TOC information to 2n-bit information words for recording.

15. The method of claim 1 wherein said step of encoding information in said long distance error correction code is comprised of receiving input information data; inserting C2 and C1 hold sections at predetermined locations in said input data and thereby forming preliminary C1 words comprised of plural data symbols; generating C2 parity symbols in response to a predetermined number of data symbols of the same number of preliminary C1 words and replacing a C2 hold section in a preliminary C1 word with said C2 parity symbols to form a precursory C1 word, generating C1 parity symbols in response to a precursory C1 word and inserting said C1 parity symbols into a C1 hold section to form a C1 code word, and using a pre-established number of said C1 code words as said long distance error correction encoded data 16. The method of claim 15 wherein said step of recording comprises recording the symbols of the C1 code words in a symbol sequence different from the symbol sequence of said preliminary C1 words.

17. The method of claim 16 wherein a preliminary C1 code word is comprised of odd and even symbols and wherein said step of recording records the odd symbols together in an odd group and records the even symbols together in an even group.

18. The method of claim 17 wherein each C1 code word is formed of in symbols including m−n C1 parity symbols, where m and n are integers; and wherein:

$$k=m\times i+2\times j-m, \text{ when } j<m/2$$

$$k=m\times i+2\times j-(m-1), \text{ when } j\geqq m/2,$$

where i is the sequential order of the preliminary C1 words of input data, j is the sequential order of the m symbols in each preliminary C1 code word and k is the order in which the m symbols are recorded on the disk.

19. The method of claim 1 wherein said step of modulating comprises supplying said TOC and user information as n-bit bytes, reading from a selected one of plural storage tables a 2n-bit symbol in response to a supplied n-bit byte, and selecting said one storage table as a function of the preceding 2n-bit symbol that had been read.

20. The method of claim 19, wherein successive 2n-bit symbols are run length limited.

21. The method of claim 20 wherein different 2n-bit symbols are stored respectively in at least two of said storage tables for the same n-bit byte.

22. The method of claim 21 wherein the 2n-bit symbols stored in one of said two storage tables exhibit positive digital sum value (DSV) and the 2n-bit symbols stored in the other of said two storage tables exhibit negative DSV.

23. The method of claim 22 wherein the step of selecting said one storage table is determined as a function of the number of "0" bits in which the preceding 2n-bit symbol terminates and accumulated DSV of a predetermined number of preceding 2n-bit symbols.

24. The method of claim 1 wherein each sector in at least said user tracks includes a sector header at a leading portion thereof; and said step of recording user information includes recording in said sector header, a sector sync pattern, a sector address, an error detection code, and subcode data.

25. The method of claim 24 wherein said subcode data in a given sector includes a subcode identifier and subcode information of a type identified by said subcode identifier.

26. The method of claim 25 wherein said subcode identifier is a subcode address.

27. The method of claim 25 wherein said subcode information includes track identifying data which identifies the track in which said given sector is recorded, copyright data which indicates whether user information in said track may be copied, and application identifying data which identifies a predetermined application allotted to said user information in said track.

28. The method of claim 25 wherein said step of encoding said user information comprises compressing a predetermined display sequence of picture data in accordance with selectively different types of compression-encoding technique, and said subcode information includes type identifying information for identifying the type of compression-encoding technique that is used to compress the data recorded in said given sector and sequence information for identifying the location in said display sequence of the picture represented by the compressed picture data that is recorded in said given sector.

29. The method of claim 25 wherein said user information is variable over time, and said subcode information includes time code data representing time information at which said user information is recorded.

30. The method of claim 25 wherein said user information is picture information representing a respective picture; and said step of recording comprises recording said picture information in at least one sector in said user tracks, and recording as subcode information first distance information representing the distance from said given sector to the sector in which picture information representing a next preceding picture is recorded and second distance information representing the distance from said given sector to the sector in which picture information representing a next following picture is recorded.

31. The method of claim 30 wherein said step of recording picture information comprises recording said picture information in a lead sector and at least one following sector.

32. The method of claim 31 wherein said step of encoding said user information comprises compressing picture data to selectively form intraframe encoded picture data or predictively encoded picture data; and each of said first and second distance information represents the distance from said given sector to the lead sector in which intraframe encoded picture data is recorded.

33. Apparatus for recording data on an optical disk having a diameter less than 140 mm, a thickness of 1.2 mm±0.1 mm and a recording area divided into a lead-in area, a program area and a lead-out area, said apparatus comprising: input means for providing user information for recording in a plurality of sectors in user tracks and table of contents (TOC) information for recording in a plurality of sectors in at least one TOC track, said TOC information including addresses of respective start sectors, each identifying a start sector of a respective user track; encoding means for encoding both said user information and said TOC information in a long distance error correction code having at least eight parity symbols; modulator means for modulating the encoded user and TOC information; and recording means for recording the modulated, encoded TOC information as embossed pits in said at least one TOC track in said lead-in area and for recording the modulated, encoded user information as embossed pits in said user tracks in said program area with a track pitch in the range between 0.646 μm and 1.05 μm.

34. The apparatus of claim 33 wherein said recording means is operative to record said embossed pits with a linear density in the range between 0.237 μm per bit and 0.378 μm per bit.

35. The apparatus of claim 33 wherein said recording means is operative to record said program area in a portion of the disk having a radius of from 20 mm to 65 mm.

36. The apparatus of claim 33 wherein said recording means is operative to record in said program area modulated, encoded TOC information substantially identical to the TOC information recorded in said lead-in area.

37. The apparatus of claim 33 wherein said TOC information includes TOC identification data for identifying a location of said at least one TOC track and configuration data for identifying a data configuration of said at least one TOC track and a sector configuration of each of said plurality of sectors.

38. The apparatus of claim 33 wherein said TOC information includes data representative of disk size.

39. The apparatus of claim 33 wherein said TOC information includes data representative of a time code associated with said user information.

40. The apparatus of claim 33 wherein said user information is reproducible at a selected one of plural playback speeds; and said TOC information includes data representative of said selected playback speed.

41. The apparatus of claim 33 wherein said encoding comprises a convolution code encoder.

42. The apparatus of claim 33 wherein said TOC information is representative of record/playback characteristics, diameter, recording capacity and number of record tracks of said optical disk.

43. The apparatus of claim 42 wherein said record/playback characteristics of said optical disk represent a read only disk, a write once disk or an erasable disk.

44. The apparatus of claim 33 wherein said modulator means is a run length limited (RLL) modulator.

45. The apparatus of claim 44 wherein said RLL modulator performs (2,10) modulation. such that successive transitions are separated by no less than 2 data bit cells and by no more than 10 data bit cells.

46. The apparatus of claim 45 wherein said modulator includes means for converting n-bit data words representing said user and TOC information to 2n-bit information words for recording.

47. The apparatus of claim 33 wherein said encoding means is comprised of means for receiving said user and TOC information as input data; means for inserting C2 and C1 hold sections at predetermined locations in said input data to thereby form preliminary C1 words comprised of plural data symbols; means for generating C2 parity symbols in response to a predetermined number of data symbols of the same number of preliminary C1 words; means for replacing a C2 hold section in a preliminary C1 word with said C2 parity symbols to form a precursory C1 word; means for generating C1 parity symbols in response to a precursory C1 word; and means for inserting said C1 parity symbols into a C1 hold section to form a C1 code word, with a pre-established number of said C1 code words constituting said long distance error correction encoded data.

48. The apparatus of claim 47 wherein said recording means further includes means for recording the symbols of the C1 code words in a symbol sequence different from the symbol sequence of said preliminary C1 words.

49. The apparatus of claim 48 wherein a preliminary C1 code word is comprised of odd and even symbols and wherein said means for recording is operative to record the odd symbols together in an odd group and the even symbols together in an even group.

50. The apparatus of claim 49 wherein each C1 code word is formed of in symbols including m−n C1 parity symbols, where m and n are integers; and wherein:

$$k=m\times i+2\times j-m, \text{ when } j<m/2$$

$$k=m\times i+2\times j-(m-1), \text{ when } j\geqq m/2,$$

where i is the sequential order of the preliminary C1 words of input data, j is the sequential order of the m symbols in each preliminary C1 code word, and k is the order in which the m symbols are recorded on the disk.

51. The apparatus of claim 33 wherein said modulator means comprises an n-to-2n modulator in which said TOC and user information are supplied as n-bit bytes, including plural storage tables, each for storing 2n-bit symbols corresponding to respective n-bit bytes; means for reading from a selected one storage table a 2n-bit symbol in response to a supplied n-bit byte; and means for selecting said storage table as a function of the preceding 2n-bit symbol that had been read.

52. The apparatus of claim 51, wherein successive 2n-bit symbols are run length limited.

53. The apparatus of claim 52 wherein at least two of said storage tables store different 2n-bit symbols for the same n-bit byte.

54. The apparatus of claim 53 wherein the 2n-bit symbols stored in one of said two storage tables exhibit positive digital sum value (DSV) and the 2n-bit symbols stared in the other of said two storage tables exhibit negative DSV.

55. The apparatus of claim 54 wherein said means for selecting said one storage table includes means for sensing the number of "0" bits in which the preceding 2n-bit symbol terminates, means for determining the accumulated DSV of a predetermined number of preceding 2n-bit symbols and means for selecting the storage table as a function of the sensed number of "0" bits and the accumulated DSV.

56. The apparatus of claim 33 wherein each sector in at least said user tracks includes a sector header at a leading portion thereof; and said recording means is operative to record in said sector header, a sector sync pattern, a sector address, an error detection code, and subcode data.

57. The apparatus of claim 59 wherein said subcode identifier is a subcode address.

58. The apparatus of claim 59 wherein said subcode information includes track identifying data which identifies the track in which said given sector is recorded, copyright data which indicates whether user information in said track may be copied, and application identifying data which identifies a predetermined application allotted to said user information in said track.

59. The apparatus of claim 56 wherein said subcode data in a given sector includes a subcode identifier and subcode information of a type identified by said subcode identifier.

60. The apparatus of claim 59 wherein said encoding means comprises means for compressing a predetermined display sequence of picture data in accordance with selectively different types of compression-encoding techniques, and said subcode information includes type identifying information for identifying the type of compression-encoding technique that is used to compress the data recorded in said given sector and sequence information for identifying the location in said display sequence of the picture represented by the compressed picture data that is recorded in said given sector.

61. The apparatus of claim 59 wherein said user information is variable over time, and said subcode information includes time code data representing time information at which said user information is recorded.

62. The apparatus of claim 59 wherein said user information is picture information representing a respective picture; and said recording means is operative to record said picture information in at least one sector in said user tracks, and to record as subcode information first distance information representing the distance from said given sector to the sector in which picture information representing a next preceding picture is recorded and second distance information representing the distance from said given sector to the sector in which picture information representing a next following picture is recorded.

63. The apparatus of claim 62 wherein said recording means is further operative to record picture information in a lead sector and at least one following sector.

64. The apparatus of claim 63 wherein said encoding means includes means for compressing picture data to selectively form intraframe encoded picture data or predictively encoded picture data; and each of said first and second distance information represents the distance from said given sector to the lead sector in which intraframe encoded picture data is recorded.

*65. A method of recording data on an optical disk having a diameter less than 140 mm and a recording area divided into a lead-in area, a program area and a lead-out area, said method comprising the steps of: providing user information for recording in a plurality of sectors in user tracks; providing table of contents (TOC) information for recording in a plurality of sectors in at least one TOC track, said TOC information including addresses of respective start sectors, each identifying a start sector of a respective user track; encoding both said user information and said TOC information in a long distance error correction code having at least eight parity symbols; modulating the encoded user and TOC information; recording the modulated, encoded TOC information in said at least one TOC track in said lead-in area; and recording the modulated, encoded user information in said user tracks in said program area with a track pitch in the range between 0.646 μm and 1.05 μm.*

*66. Apparatus for recording data on an optical disk having a diameter less than 140 mm and a recording area divided into a lead-in area, a program area and a lead-out area, said apparatus comprising: input means for providing user information for recording in a plurality of sectors in user tracks and table of contents (TOC) information for recording in a plurality of sectors in at least one TOC track, said TOC information including addresses of respective start sectors, each identifying a start sector of a respective user track; encoding means for encoding both said user information and said TOC information in a long distance error correction code having at least eight parity symbols; modulator means for modulating the encoded user and TOC information; and recording means for recording the modulated, encoded TOC information in said at least one TOC track in said lead-in area and for recording the modulated, encoded user information in said user tracks in said program area with a track pitch in the range between 0.646 μm and 1.05 μm.*

*67. A method of recording data on an optical disk having a diameter less than 140 mm and a recording area divided into a lead-in area, a program area and a lead-out area, said method comprising the steps of providing user information for recording in a plurality of sectors in user track regions; providing table of contents (TOC) information for recording in a plurality of sectors in at least one TOC track, said TOC information including addresses of respective start sectors, each identifying a start sector of a respective user track; encoding both said user information and said TOC information in a long distance error correction code having at least eight parity symbols; modulating the encoded user and TOC information; recording the modulated, encoded TOC information in said at least one TOC track in said lead-in area; and recording the modulated, encoded user information in said user track regions in said program area with a track pitch in the range between 0.646 μm and 1.05 μm and with a linear density in the range between 0.237 μm per bit and 0.387 μm per bit.*

*68. Apparatus for recording data on an optical disk having a diameter less than 140 mm and a recording area divided into a lead-in area, a program area and a lead-out area, said apparatus comprising: input means for providing user information for recording in a plurality of sectors in user track regions and table of contents (TOC) information for recording in a plurality of sectors in at least one TOC track, said TOC information including addresses of respective start sectors, each identifying a start sector of a respective user track; encoding means for encoding both said user information and said TOC information in a long distance error correction code having at least eight parity symbols; modular means for modulating the encoded user and TOC information; and recording means for recording the modulated, encoded TOC information in said at least one TOC track in said lead-in area and the modulated, encoded user information in said user track regions in said program area with a track pitch in the range between 0.646 μm and 1.05 μm and with a linear density in the range between 0.237 μm per bit and 0.387 μm per bit.*

*69. A method of recording data on an optical disk having a diameter less than 140 mm and a recording area divided into a lead-in area, a program area and a lead-out area, said method comprising the steps of: providing user information for recording in a plurality of sectors in user track regions; providing table of contents (TOC) information for recording in a plurality of sectors in at least one TOC track, said TOC information including addresses of respective start sectors, each identifying a start sector of a respective user track; encoding both said user information and said TOC information in a long distance error correction code having at least eight parity symbols; modulating the encoded user and TOC information; recording the modulated, encoded TOC information in said at least one TOC track in said lead-in area; and*

*recording the modulated, encoded user information in said user track regions in said program area with a track pitch in the range between 0.7 μm and 0.9 μm.*

*70. Apparatus for recording data on an optical disk having a diameter less than 140 mm and a recording area divided into a lead-in area, a program area and a lead-out area, said apparatus comprising: input means for providing user information for recording in a plurality of sectors in user track regions and table of contents (TOC) information for recording in a plurality of sectors in at least one TOC track, said TOC information including addresses of respective start sectors, each identifying a start sector of a respective user track; encoding means for encoding both said user information and said TOC information in a long distance error correction code having at least eight parity symbols; modular means for modulating the encoded user and TOC information; and recording means for recording the modulated, encoded TOC information in said at least one TOC track in said lead-in area and the modulated, encoded user information in said user track regions in said program area with a track pitch in the range between 0.7 μm and 0.9 μm.*

*71. A method of recording data on an optical disk having a diameter less than 140 mm and a recording area divided into a lead-in area, a program area and a lead-out area, said method comprising the steps of: providing user information for recording in a plurality of sectors in user track regions; providing table of contents (TOC) information for recording in a plurality of sectors in at least one TOC track, said TOC information including addresses of respective start sectors, each identifying a start sector of a respective user track; encoding both said user information and said TOC information in a long distance error correction code having at least eight parity symbols; modulating the encoded user and TOC information; recording the modulated, encoded TOC information in said at least one TOC track in said lead-in area; and recording the modulated, encoded user information in said user track regions in said program area with a track pitch in the range between 0.646 μm and 1.05 μm, wherein said optical disk has a linear velocity in the range of 3.3 m to 5.3 m per second during a playback operation.*

*72. Apparatus for recording data on an optical disk having a diameter less than 140 mm and a recording area divided into a lead-in area, a program area and a lead-out area, said apparatus comprising: input means for providing user information for recording in a plurality of sectors in user track regions and table of contents (TOC) information for recording in a plurality of sectors in at least one TOC track, said TOC information including addresses of respective start sectors, each identifying a start sector of a respective user track; encoding means for encoding both said user information and said TOC information in a long distance error correction code having at least eight parity symbols; modular means for modulating the encoded user and TOC information; and recording means for recording the modulated, encoded TOC information in said at least one TOC track in said lead-in area and the modulated, encoded user information in said user track regions in said program area with a track pitch in the range between 0.646 μm and 1.05 μm, wherein said optical disk has a linear velocity in the range of 3.3 m to 5.3 m per second during a playback operation.*

* * * * *